(12) United States Patent
Chen et al.

(10) Patent No.: US 11,233,963 B2
(45) Date of Patent: Jan. 25, 2022

(54) DEVICES AND METHODS FOR OBTAINING THREE-DIMENSIONAL SHAPE INFORMATION USING POLARIZATION AND PHASE DETECTION PHOTODIODES

(71) Applicant: OMNIVISION TECHNOLOGIES, INC., Santa Clara, CA (US)

(72) Inventors: Wenshou Chen, Santa Clara, CA (US); Guansong Liu, San Jose, CA (US); Yiyi Ren, San Jose, CA (US); Chin Poh Pang, Pleasanton, CA (US); Badrinath Padmanabhan, San Jose, CA (US); Alireza Bonakdar, San Jose, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 145 days.

(21) Appl. No.: 16/729,088

(22) Filed: Dec. 27, 2019

(65) Prior Publication Data
US 2021/0203872 A1 Jul. 1, 2021

(51) Int. Cl.
*H04N 5/3745* (2011.01)
*H01L 27/146* (2006.01)
(Continued)

(52) U.S. Cl.
CPC ..... *H04N 5/3745* (2013.01); *H01L 27/14627* (2013.01); *H01L 27/14645* (2013.01); *H04N 5/232122* (2018.08); *H04N 5/378* (2013.01)

(58) Field of Classification Search
CPC .............. H04N 5/3745; H04N 5/378; H04N 5/232122; H04N 9/04557; H04N 13/207;
(Continued)

(56) References Cited

U.S. PATENT DOCUMENTS 5,890,095 A   3/1999 Barbour et al.
9,807,294 B2 10/2017 Liu et al.
(Continued)

OTHER PUBLICATIONS

Kadambi, A., et al. "Polarized 3D: High-Quality Depth Sensing with Polarization Cues," ICCV Paper, pp. 3370-3378, 2015.
(Continued)

*Primary Examiner* — Shahbaz Nazrul
(74) *Attorney, Agent, or Firm* — Christensen O'Connor Johnson Kindness PLLC

(57) ABSTRACT

In some embodiments, an image sensor is provided. The image sensor comprises a plurality of photodiodes arranged as a photodiode array. The plurality of photodiodes includes a first set of photodiodes configured as phase detection photodiodes, and a second set of photodiodes configured as polarization detection photodiodes. In some embodiments, a controller is provided. The controller comprises circuitry configured to process signals from a first set of photodiodes of a photodiode array to obtain depth information; process signals from a second set of photodiodes of the photodiode array to obtain polarization information; process the polarization information to obtain an ambiguous set of surface normals; and process the ambiguous set of surface normals using the depth information to obtain a three-dimensional shape image.

20 Claims, 16 Drawing Sheets

(51) Int. Cl.
*H04N 5/378* (2011.01)
*H04N 5/232* (2006.01)

(58) Field of Classification Search
CPC ......... H01L 27/14645; H01L 27/14627; H01L 27/14621; H01L 27/14605; H01L 27/14607; H01L 27/14634
See application file for complete search history.

(56) References Cited

U.S. PATENT DOCUMENTS

| | | | |
|---|---|---|---|
| 10,260,866 B2 | 4/2019 | Kadambi et al. | |
| 10,694,169 B1* | 6/2020 | Topliss | G06T 7/408 |
| 10,924,689 B1* | 2/2021 | Duckett, III | A61B 1/00186 |
| 2018/0292310 A1* | 10/2018 | Kojima | G01J 3/00 |
| 2020/0103511 A1* | 4/2020 | Jin | H01L 27/1463 |
| 2020/0204786 A1* | 6/2020 | Nakata | H04N 13/218 |
| 2020/0213487 A1* | 7/2020 | Nakata | H04N 9/04551 |
| 2021/0126033 A1* | 4/2021 | Yang | H04N 5/345 |
| 2021/0176447 A1* | 6/2021 | Mann | H04N 13/257 |
| 2021/0255584 A1* | 8/2021 | Choi | H04N 9/04557 |

OTHER PUBLICATIONS

Yuffa, A., et al. "Three-dimensional facial recognition using passive long-wavelength infrared polarimetric imaging," OSA Publishing, <https://www.osapublishing.org/ao/abstract.cfm?uri=ao-53-36-8514>, Nov. 13, 2019, 4 pages.

Pang, C. P., et al., "Image Sensor with Shared Microlens," U.S. Appl. No. 16/711,237, filed Dec. 11, 2019.

* cited by examiner

DEVICES AND METHODS FOR OBTAINING THREE-DIMENSIONAL SHAPE INFORMATION USING POLARIZATION AND PHASE DETECTION PHOTODIODES

BACKGROUND INFORMATION

Field of the Disclosure

This disclosure relates generally to image sensors, and in particular but not exclusively, relates CMOS image sensors and applications thereof.

Background Information

Image sensors have become ubiquitous and are now widely used in digital cameras, cellular phones, security cameras, as well as, medical, automobile, and other applications. As image sensors are integrated into a broader range of electronic devices it is desirable to enhance their functionality, performance metrics, and the like in as many ways as possible (e.g., resolution, power consumption, dynamic range, etc.) through both device architecture design as well as image acquisition processing.

The typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge of each of the pixels may be measured as an output voltage of each photosensitive element that varies as a function of the incident image light. In other words, the amount of image charge generated is proportional to the intensity of the image light, which is utilized to produce a digital image (i.e., image data) representing the external scene.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified. To easily identify the discussion of any particular element or act, the most significant digit or digits in a reference number refer to the figure number in which that element is first introduced.

Figure 1:
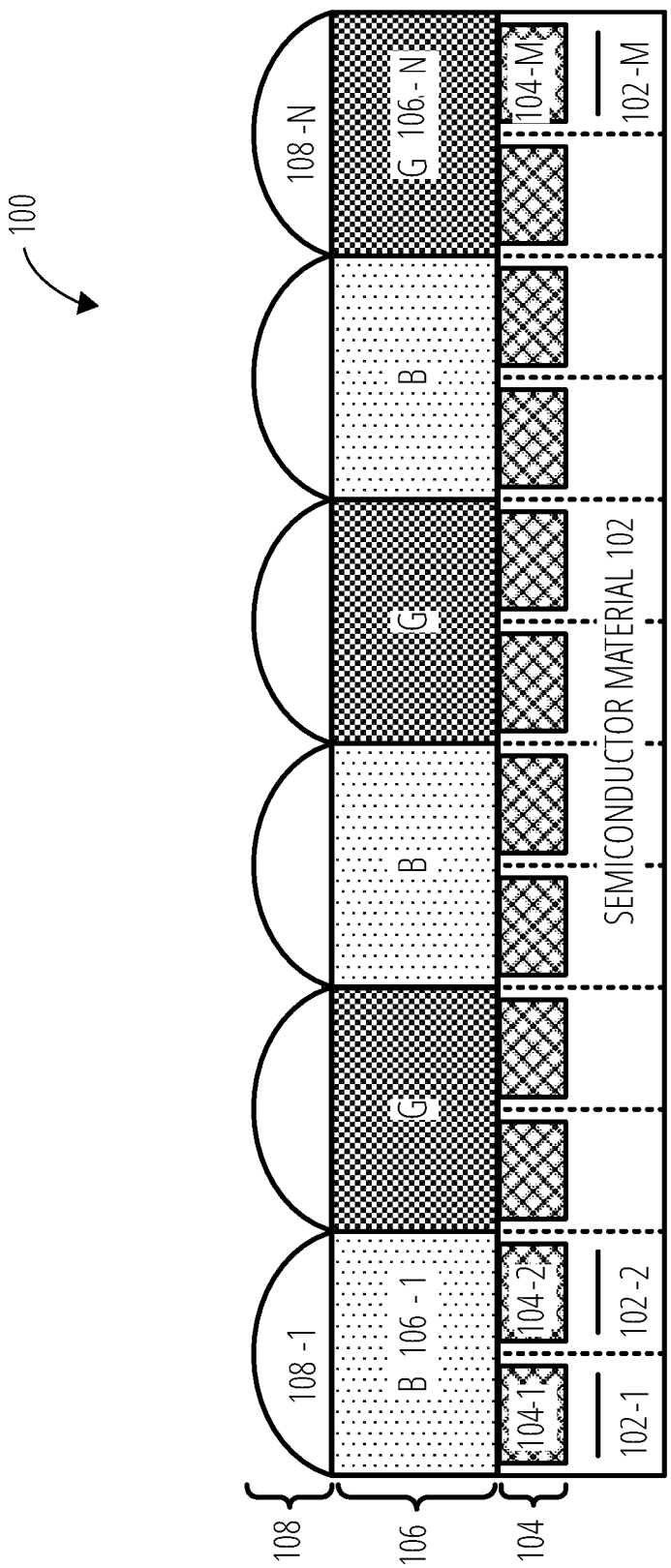
FIG. 1 illustrates a non-limiting example embodiment of a cross-sectional view of an image sensor 100 with shared microlenses, according to various aspects of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Embodiments of an apparatus, system, and method each including or otherwise related to an image sensor capable of generating three-dimensional shape and depth images are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example and embodiment. Furthermore, the particular features, structures, or characteristics may be combined in any suitable manner in one or more examples and embodiments.

Throughout this specification, several terms of art are used. These terms are to take on their ordinary meaning in the art from which they come, unless specifically defined herein or the context of their use would clearly suggest otherwise.

Embodiments described herein utilize an image sensor that includes photodiodes configured to collect polarization information and photodiodes configured to collect depth information, in order to generate three-dimensional shape and depth images. In some embodiments, the photodiodes configured to collect polarization information are aligned with a polarization grid in order to generate information that can be used to determine a set of ambiguous surface normals. In some embodiments, the photodiodes configured to collect depth information may include phase detection photodiodes that share a common color filter and microlens. In some embodiments, the depth information may be used to solve the ambiguities in the ambiguous surface normals, thereby creating the three-dimensional shape and depth image. Combining phase detection photodiodes and polarization detection photodiodes in a single image sensor provides multiple technical benefits, including but not limited to the elimination of registration errors between depth information and polarization information captured by separate image sensors, and the simplification of a device that includes the single combined image sensor instead of a separate depth sensor and polarization sensor.

FIG. 1-FIG. 4 illustrate representative views of a non-limiting example embodiment of an image sensor 100 including a semiconductor material 102, a plurality of photodiodes 104, a plurality of color filters 106, and a plurality of microlenses 108. It is appreciated that the views presented in FIG. 1-FIG. 4 may omit certain elements of image sensor 100 to avoid obscuring details of the disclosure. It is further appreciated that in some embodiments, image sensor 100 may not necessarily include all elements illustrated in FIG. 1-FIG. 4.

FIG. 1 illustrates a non-limiting example embodiment of a cross-sectional view of an image sensor 100 with shared microlenses, according to various aspects of the present disclosure. More specifically, cross-sectional view is a representative view taken along a row or column of image sensor 100 (e.g., column "C1" illustrated in FIG. 2). Referring back to FIG. 1, image sensor 100 includes plurality of photodiodes 104 arranged as a photodiode array containing M individual photodiodes (e.g., photodiode 104-1, photodiode 104-2, . . . , photodiode 104-M), each of the plurality of photodiodes 104 disposed within respective portions of semiconductor material 102 (e.g., silicon). In other words, there is a 1-to-1 ratio between the number of respective portions of semiconductor material 102 and the number of individual photodiodes 104. In some embodiments, individual photodiodes included in the plurality of photodiodes 104 may correspond to doped regions within the respective portions of semiconductor material 102 that are collectively responsive to incident light (e.g., the doped regions may form a PN junction that generates electrical or image charge proportional to a magnitude or intensity of the incident light). In the illustrated embodiment, each of the respective portions of semiconductor material 102 (e.g., semiconductor material 102-1, semiconductor material 102-2, . . . , semiconductor material 102-M) include a respective one of the plurality of photodiodes 104 such that the respective portions of semiconductor material 102 each have a first lateral area that is greater than the lateral area of a corresponding one of the individual photodiodes included in the plurality of photodiodes 104. For example, photodiode 104-1 is formed within respective portion of semiconductor material 102-1, but notably does not laterally extend across the entirety of the respective portion of semiconductor material 102-1. Thus, it is appreciated that individual photodiodes included in the plurality of photodiodes 104 do not necessarily extend laterally across the entire cross-sectional area of the respective portions of semiconductor material 102. Rather, portions of semiconductor material 102 disposed between adjacent photodiodes (e.g., region of semiconductor material 102 between photodiode 104-1 and photodiode 104-2) may be utilized to form additional structures within the semiconductor material (e.g., isolation trenches, floating diffusion, and the like). In other embodiments, the respective portions of the semiconductor material 102 and the associated first lateral area corresponds to a largest lateral area of individual photodiodes included in the plurality of photodiodes 104. In other words, in some embodiments the first lateral area corresponds to an area of an individual photodiode included in the plurality of photodiodes 104.

In the illustrated embodiment, image sensor 100 further includes plurality of color filters 106 arranged as a color filter array optically aligned with the photodiode array formed by plurality of photodiodes 104. The plurality of color filters 106 may include N color filters (e.g., color filter 106-1, . . . color filter 106-N) that each have a specific spectral photoresponse to filter incident light propagating through an individual one of the plurality of color filters to a group of the plurality of photodiodes 104. For example, blue color filter 106-1 is optically aligned with at least two photodiodes, photodiode 104-1 and photodiode 104-2, such that the image charge generated in response to incident light by photodiode 104-1 and photodiode 104-2 is substantially proportional to the intensity or magnitude of the blue component within the spectrum of light incident upon photodiode 104-1 and photodiode 104-2. It is appreciated that plurality of color filters 106 is not limited to a single spectral photoresponse and that other types of color filters may be included in image sensor 100 with corresponding spectral photoresponse substantially equivalent to any one of, or a combination of, red, green, blue, panchromatic (i.e., clear or white), yellow, cyan, magenta, or other colors. In some embodiments, the color filter array may consequently be utilized to generate image signals representative of the incident light within at least the visible spectrum to generate an image representative of an external scene. In the illustrated embodiment, individual color filters included in plurality of color filters 106 are optically aligned with groups of at least two photodiodes included in plurality of photodiodes 104 such that individual color filters (e.g., color filter 106-1, . . . , color filter 106-N) each have a second lateral area greater than the first lateral area of a corresponding optically aligned photodiode (e.g., photodiode 104-1, photodiode 104-2, . . . photodiode 104-M).

As illustrated in FIG. 1, image sensor 100 includes plurality of microlenses 108 arranged as a microlens array optically aligned with the color filter array (e.g., formed by plurality of color filters 106) and the photodiode array (e.g., formed by plurality of photodiodes 104). Each of the microlenses may be formed of a polymer (e.g., polymethylmethacrylate, polydimethylsiloxane, etc.) or other material and be shaped to have optical power for converging, diverging, or otherwise directing light incident upon the plurality of microlenses 108 (e.g., microlens 108-1) through a corresponding optically aligned one (e.g., color filter 106-1) of the plurality of color filters 106 to a respective group (e.g., at least photodiode 104-1 and photodiode 104-2) of photodiodes included in the plurality of photodiodes 104. In some embodiments there is a 1-to-1 ratio between the number of color filters included in the plurality of color filters 106 and the number of microlenses included in the plurality of microlenses 108, which may be less than the number of photodiodes included in the plurality of photodiodes 104. In some embodiments, the ratio of photodiodes to microlenses and/or color filters may be 2-to-1, 3-to-1, 4-to-1, or otherwise. Accordingly, individual microlenses (e.g., microlens 108-1, . . . , microlens 108-N) included in the plurality of microlenses 108 may have a third lateral area that is greater than the first lateral area of individual photodiodes included in the plurality of photodiodes 104, but the third lateral area is less than the second lateral area of the color filters included in the plurality of color filters 106.

It is appreciated that image sensor 100 may be fabricated by semiconductor device processing and microfabrication techniques known by one of ordinary skill in the art. In one embodiment, fabrication of image sensor 100 may include providing a semiconductor material (e.g., a silicon wafer having a front side and a back side), forming a mask or template (e.g., out of cured photo resist) on the front side of the semiconductor material 102 via photolithography to provide a plurality of exposed regions of the front side of semiconductor material 102, doping (e.g., via ion implantation, chemical vapor deposition, physical vapor deposition, and the like) the exposed portions of the semiconductor material 102 to form the plurality of photodiodes 104 that extend into semiconductor material 102 from the front side of semiconductor material 102, removing the mask or template (e.g., by dissolving the cured photoresist with a solvent), and planarizing (e.g., via chemical mechanical planarization or polishing) the front side of semiconductor material 102. In the same or another embodiment, photolithography may be similarly used to form the plurality of color filters 106 (e.g., cured pigmented polymers having a desired spectral photoresponse) and the plurality of microlenses 108 (e.g., polymer based microlenses having a target shape and size formed from a master mold or template). It is appreciated that the described techniques are merely demonstrative and not exhaustive and that other techniques may be utilized to fabricate one or more components of image sensor 100.

Figure 2:
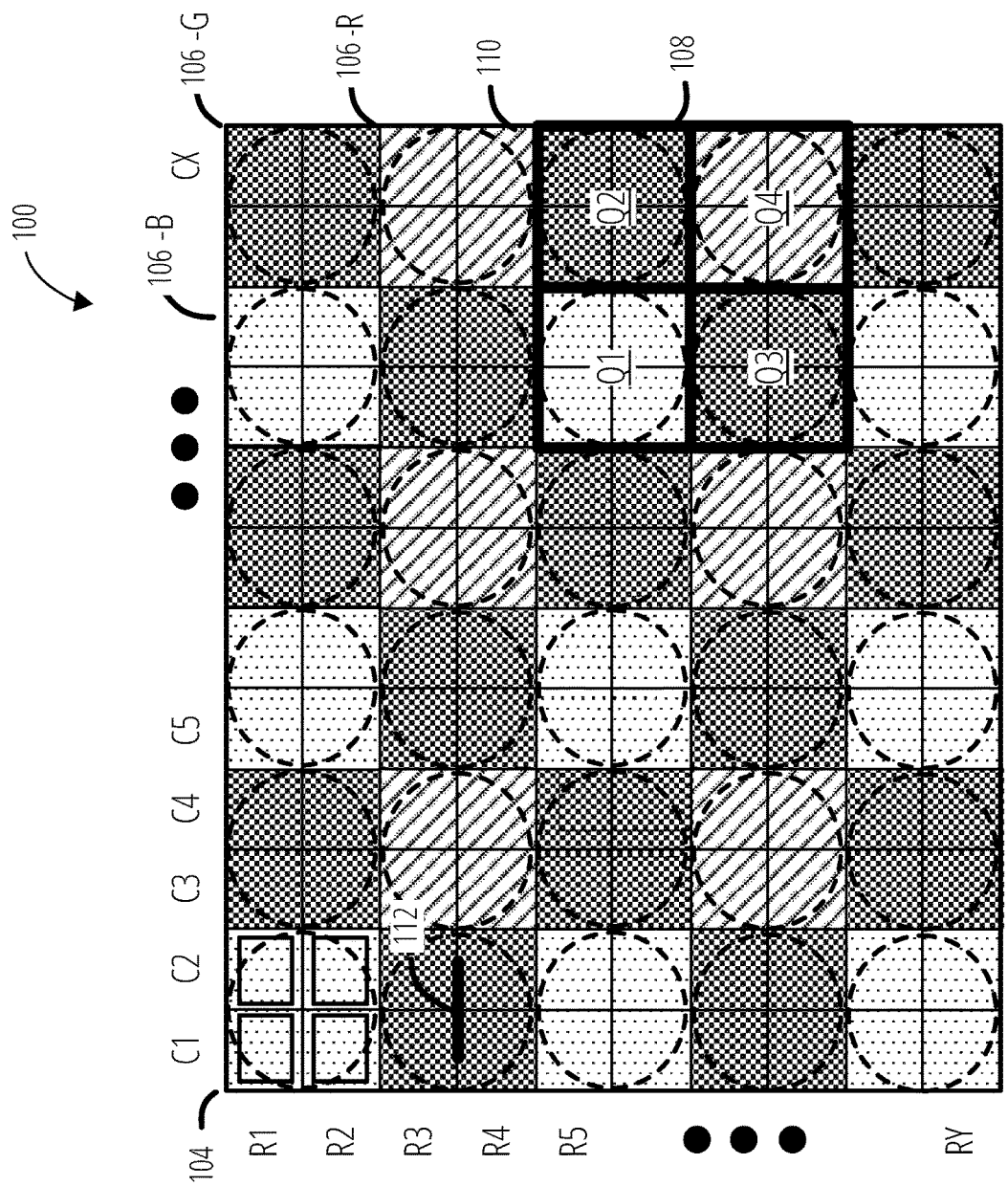
FIG. 2 illustrates a top view of a non-limiting example embodiment of an image sensor with shared microlenses, according to various aspects of the present disclosure.

FIG. 2 illustrates a top view of a non-limiting example embodiment of an image sensor 100 with shared microlenses, according to various aspects of the present disclosure. As illustrated, image sensor 100 may be addressed or otherwise described as an array including a plurality of rows (e.g., R1, R2, R3, . . . , RY) and columns (e.g., C1, C2, C3, . . . , CX). Each element of the array with Y rows and X columns may include a respective photodiode included in the plurality of photodiodes 104, color filter included in the plurality of color filters 106, and microlens included in the plurality of microlenses 108. For example, the array element associated with row 1 column 1 of the image sensor 100 illustrated in FIG. 2 may be representative of a top-down view illustrated in FIG. 1 extending from microlens 108-1 and through color filter 106-1, photodiode 104-1, and respective portion of semiconductor material 102-1. Referring back to FIG. 2, it is appreciated that certain elements may be omitted or unlabeled (e.g., plurality of photodiodes 104, plurality of color filters 106, respective portions of semiconductor material 102, and the like illustrated in FIG. 1) to avoid obscuring certain aspects of the disclosure.

In the illustrated embodiment of FIG. 2, the plurality of color filters 106 form a color filter array including blue color filters 106-B, green color filters 106-G, and red color filters 106-R arranged in a pre-determined pattern. The pre-determined pattern of the color filter array includes a plurality of tiled minimal repeating units (e.g., repeat unit 110) corresponding to groups of four abutting color filters included in the plurality of color filters 106. The groups of four abutting color filters include a first color filter with a first spectral photoresponse, a second color filter with a second spectral photoresponse, a third color filter with a third spectral photoresponse, and a fourth color filter with a fourth spectral photoresponse. In some embodiments, the second spectral photoresponse is substantially identical to the third spectral photoresponse. In the same or another embodiment the first spectral photoresponse and the fourth spectral photoresponse are different from each other, the second spectral photoresponse, and the third spectral photoresponse. In some embodiments the second color filter and the third color filter are substantially identical in terms of spectral photoresponse and are disposed diagonally opposite one another within an individual one of the plurality of tiled minimal repeating units.

As illustrated in FIG. 2, each of the plurality of tiled minimal repeating units are representative of a full color pixel (i.e., image pixel) of image sensor 100 with a predetermined arrangement of different color filters such that image signals (e.g., electrical signals having a magnitude proportional to intensity of incident light) generated by the underlying photodiodes are collectively representative of the visible spectrum of electromagnetic radiation. As illustrated, repeat unit 110 includes four quadrants (e.g., Q1 with a blue color filter, Q2 with a first green color filter, Q3 with a second green color filter, and Q4 with a red color filter). Each quadrant corresponds to a subpixel and collectively repeat unit 110 forms an image pixel of image sensor 100. Additionally, each quadrant of the minimal repeating unit (e.g., repeat unit 110) includes a group of four photodiodes arranged in a 2-by-2 pattern or array (e.g., as illustrated in the top left of FIG. 2) that share (i.e., are optically aligned with) a common color filter and a common microlens. More specifically, in the illustrated embodiment, each of the plurality of color filters 106 extend across individual groups of four adjacent photodiodes 104 within a corresponding quadrant of a respective one of the minimally repeating units. In some embodiments each of the plurality of microlenses 108 is symmetric and optically centered over a corresponding 2-by-2 array of photodiodes and color filter included in a corresponding pixel or subpixel of image sensor 100. For example, diameter 112 of the corresponding microlens illustrated in FIG. 2 substantially extends across two columns of image sensor 100. It is appreciated that that due to spacing between individual microlenses (i.e., in embodiments where the individual microlenses do not contact one another) the diameter of a microlens may not necessarily span exactly two columns or rows of image sensor 100. Rather, the diameter of an individual microlens may be greater than one row or column of image sensor 100, but less than or equal to two columns or rows. It is further appreciated that in some embodiments, some or all of the plurality of microlenses 106 may not necessarily be symmetric (i.e., the microlenses may be asymmetric).

Figure 3:
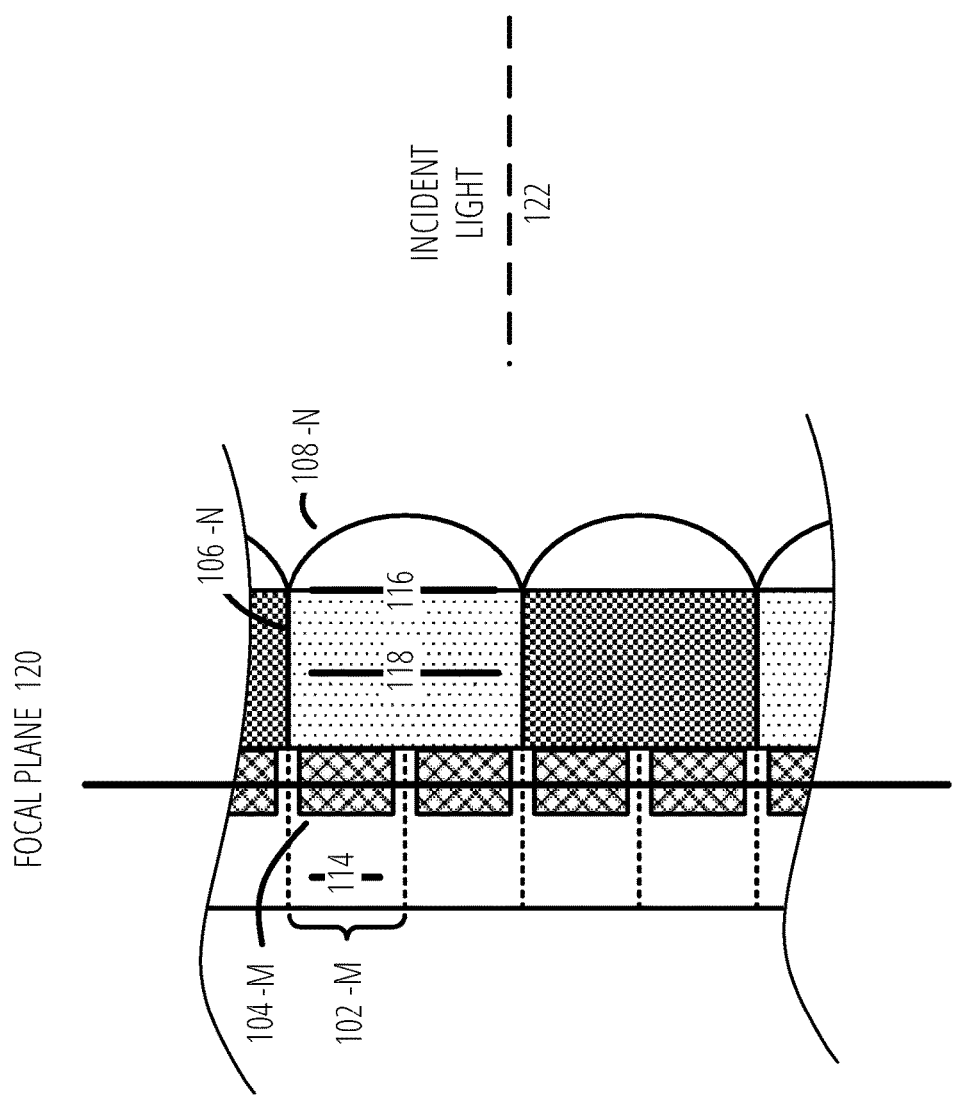
FIG. 3 illustrates a cross-sectional view of a non-limiting example embodiment of an image sensor relative to a focal plane of the image sensor, according to various aspects of the present disclosure.

FIG. 3 illustrates a cross-sectional view of a non-limiting example embodiment of an image sensor 100 relative to a focal plane 120 of the image sensor 100, according to various aspects of the present disclosure. More specifically, the illustrated embodiment demonstrates an exemplary relationship between the first lateral area 114 of respective portions of semiconductor material 102, the second lateral area 118 of the plurality of color filters 106, and the third lateral area 116 of the plurality of microlenses 108 to the focal plane 120 of the image sensor 100. In the illustrated embodiment, the first lateral area, the second lateral area, and the third lateral area are taken along respective cross-sectional planes of the photodiode array (e.g., formed by the plurality of photodiodes 104 within respective portions of semiconductor material 102), the color filter array (e.g., formed by the plurality of color filters 106), and the microlens array (e.g., formed by the plurality of microlenses 108) that are each substantially parallel with the focal plane 120 (i.e., where incident light 122 is focused upon) of image sensor 100. It is appreciated that in some embodiments the first lateral area 114, the second lateral area 118, and the third lateral area 116 are each taken along a largest cross-section of an optically aligned one of the respective semiconductor portions 102-1 . . . 102-M, the plurality of color filters 106, and of the plurality of microlenses 108 that is substantially parallel with the focal plane 120 of image sensor 100.

Figure 4:
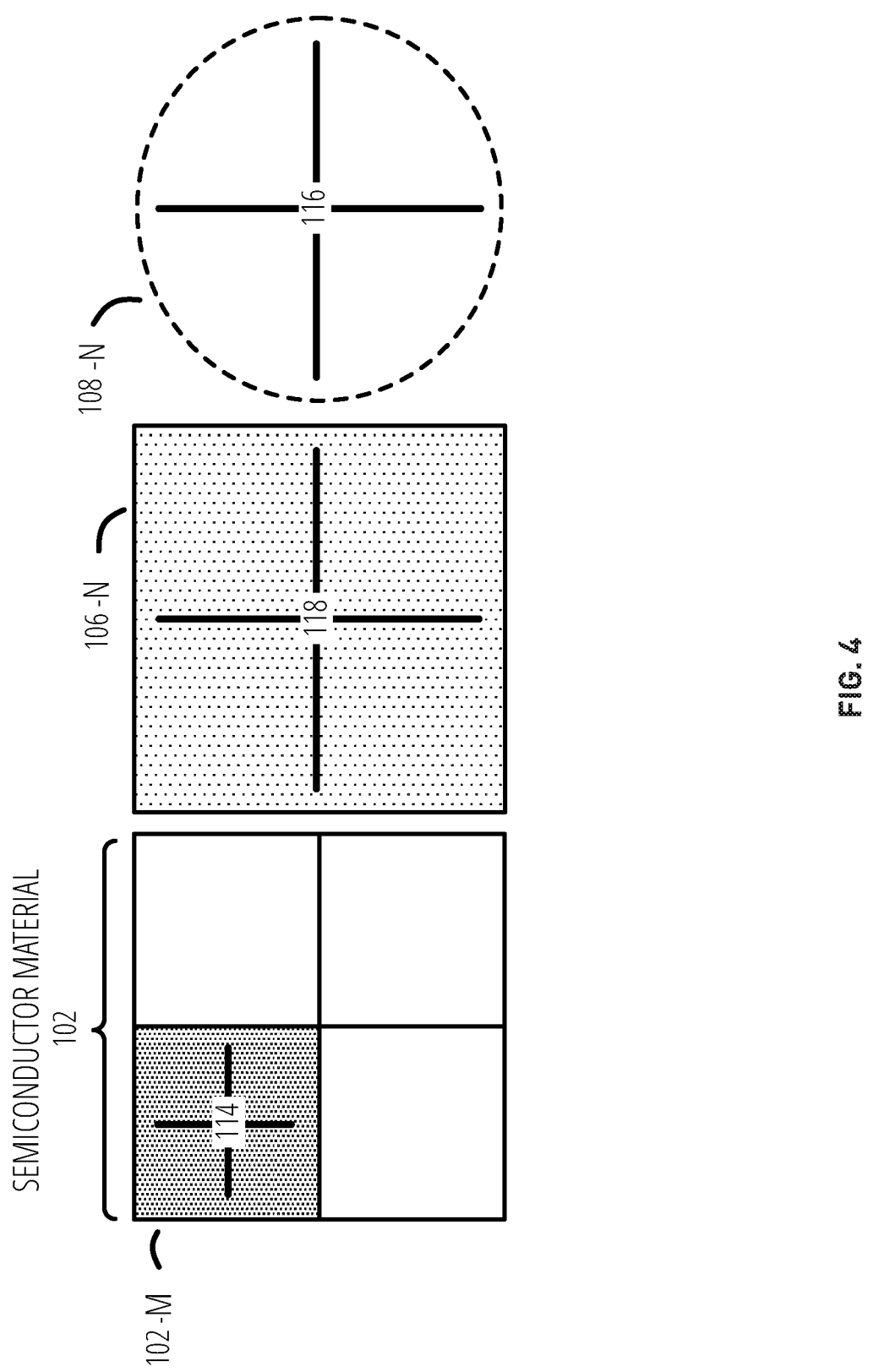
FIG. 4 illustrates an exemplary relative size comparison between lateral areas of a respective portion of semiconductor material, color filter, and a microlens included in a subpixel of image sensor, according to various aspects of the present disclosure.

FIG. 4 illustrates an exemplary relative size comparison between lateral areas of a respective portion of semiconductor material 102-M, color filter 106-N, and a microlens 108-N included in a subpixel of image sensor 100, according to various aspects of the present disclosure. In the illustrated embodiment, each of the respective portions (e.g., semiconductor material 102-M) of semiconductor material 102 have a first lateral area 114. Each of the plurality of color filters 106 (e.g., color filter 106-N) have a second lateral area 118 greater than the first lateral area 114. Each of the plurality of microlenses 108 (e.g., 108-N) have a third lateral area 116 greater than the first lateral area 114, but less than the second lateral area 118. In some embodiments, the third lateral area 116 of each of the plurality of microlenses 108 has a circular shape with a diameter extending or otherwise spanning over approximately two of the respective portions of the semiconductor material 102.

Figure 5:
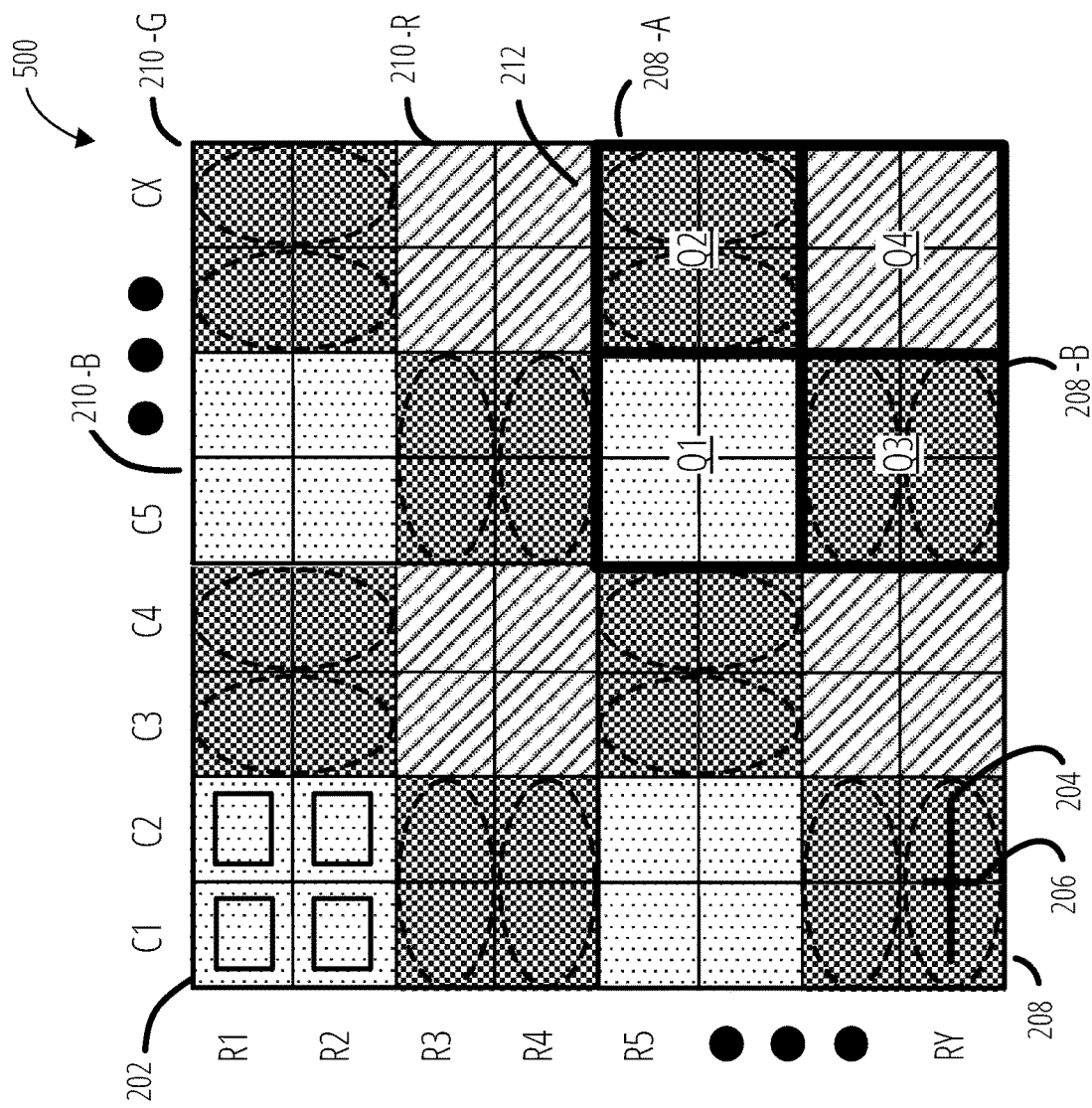
FIG. 5 illustrates a top view of a non-limiting example embodiment of an image sensor with shared microlenses, according to various aspects of the present disclosure.

FIG. 5 illustrates a top view of a non-limiting example embodiment of an image sensor 500 with shared microlenses, according to various aspects of the present disclosure. Image sensor 500 is substantially similar to image sensor 100 illustrated in FIG. 1-FIG. 4 and includes a plurality of photodiodes 202, plurality of color filters 210, and plurality of microlenses 208. One difference between the architecture of image sensor 500 and image sensor 100 is the arrangement and shape of the plurality of microlenses 208 relative to the plurality of microlenses 108.

Referring back to FIG. 5, image sensor 500 includes a plurality of tiled minimal repeating units (e.g., repeat unit 212) corresponding to groups of four abutting color filters included in the plurality of color filters 210. Repeat unit 212 may be described by four quadrants (e.g., Q1, Q2, Q3, and Q4) with each quadrant including a respective color filter (e.g., blue, green, green, or red color filter) included in the plurality of color filters 210. Each of the quadrants includes groups of four adjacent photodiodes (e.g., arranged in a 2-by-2 array as illustrated in the top left corner of image sensor 500). The plurality of microlenses 208 form a microlens array that includes a plurality of tiled minimal repeating microlens units, each including a first pair of microlenses 208-A and a second pair of microlenses 208-B respectively disposed across the second color filter (e.g., within Q2 of repeat unit 212) and the third color filter (e.g., within Q3 of repeat unit 212) of the tiled minimal repeating unit of the color filter array. As illustrated, the first pair of microlenses 208-A is oriented longitudinally orthogonal to the second pair of microlenses 208-B. Individually, the microlenses included in the plurality of tiled minimal repeating microlens units are optically aligned over two adjacent photodiodes included in the individual groups of four adjacent photodiodes with a length 204 extending over at least two adjacent photodiodes and a width 206 extending over approximately one of the photodiodes included in the plurality of photodiodes 202.

It is appreciated that in the illustrated embodiment, Q2 and Q3 (e.g., the quadrants containing green color filters) each include two microlenses that extend over two columns and one row (or two rows and one column), but in other embodiments similarly shaped microlenses may also be disposed within the other quadrants (e.g., Q1 and Q4 of repeat unit 212). Further still, it is appreciated that in some embodiments, Q1 and Q4 may each include no microlenses, a plurality of microlenses (e.g., a 2-by-2 array of four microlenses centered within an individual quadrant of repeat unit 212), a single microlens (e.g., a microlens extending over two columns and two rows similar to the plurality of microlenses 106 illustrated in FIG. 1-FIG. 3), or a combination thereof.

Figure 6:
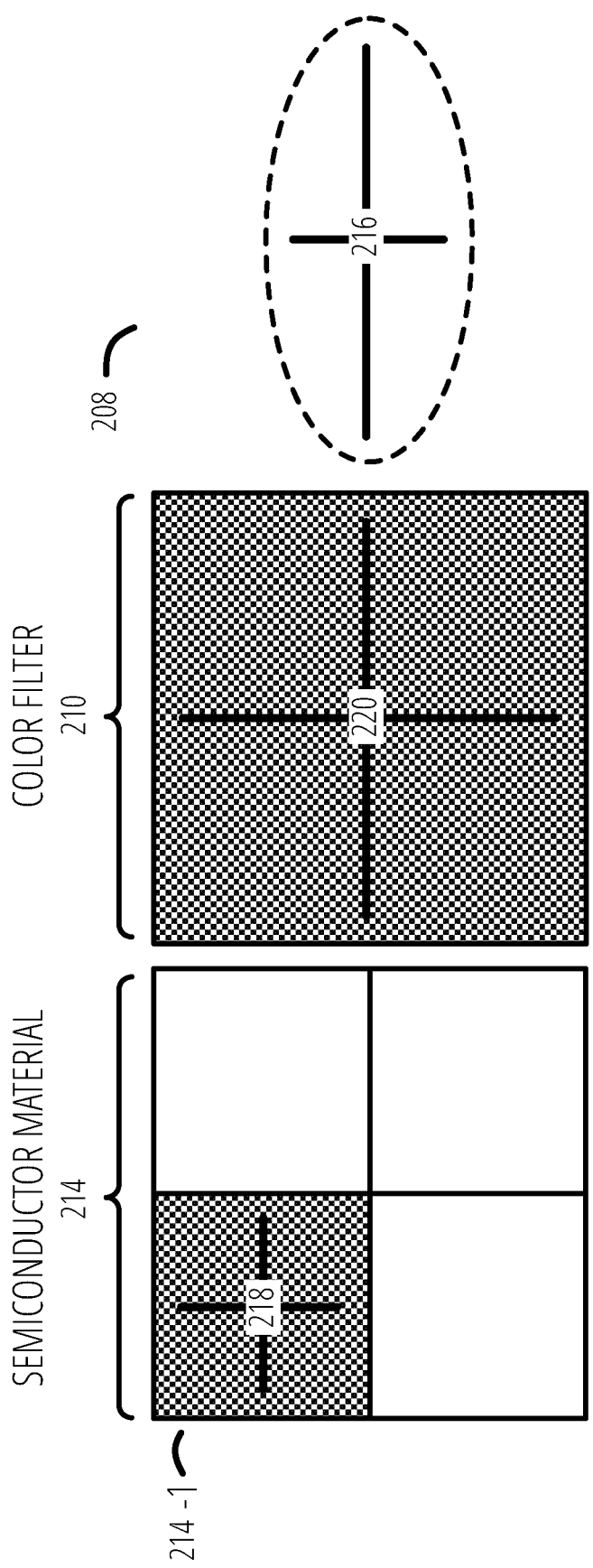
FIG. 6 illustrates a relative size comparison between lateral areas of semiconductor material, a color filter, and a microlens included in a subpixel of an image sensor, according to various aspects of the present disclosure.

FIG. 6 illustrates a relative size comparison between lateral areas of semiconductor material 214, a color filter 210, and a microlens 208 included in a subpixel (e.g., Q3 of repeat unit 212 illustrated in FIG. 5) of image sensor 500, according to various aspects of the present disclosure. As illustrated, each respective portion (e.g., semiconductor material 214-1) of semiconductor material 214 has a first lateral area and the color filter 210 has a second lateral area 220 greater than the first lateral area. The microlens 208 has a third lateral area 216 that has an ovoidal shape with a length extending approximately over two of the respective portions of semiconductor material 214 and a width extending approximately one of the respective portions of semiconductor material 214. Thus, the third lateral area 216 is larger than the first lateral area 218, but less than the second lateral area 220.

The image sensors discussed in FIG. 1-FIG. 6 are configured to use shared microlens configurations in order to conduct phase detection, and to thereby obtain depth information for external scenes. The rough depth information obtained by the photodiodes that share microlenses is suitable for use in autofocus techniques. However, if detailed information is desired for creating a three-dimensional shape image, additional information is desirable in order to enhance the quality of the data.

In some embodiments of the present disclosure, a shared microlens photodiode array as discussed above is enhanced with photodiodes configured to detect polarization information. In some embodiments, the polarization information may include angle of linear polarization (AoLP) information and degree of linear polarization (DoLP) information. Surface reflections from an object change the polarization of light reflected therefrom. By detecting the AoLP information and DoLP information, a set of surface normals can be extracted, each of which includes an azimuth value and a zenith value. In some embodiments, the surface normals computed solely using polarization information are ambiguous—that is, the azimuth value that is computed may be the actual value, or may be less than the actual value by pi radians. By using the depth information obtained from the phase detection photodiodes, embodiments of the present disclosure may disambiguate the ambiguous surface normals obtained from the polarization information, and a detailed three-dimensional shape image may be generated.

Figure 7:
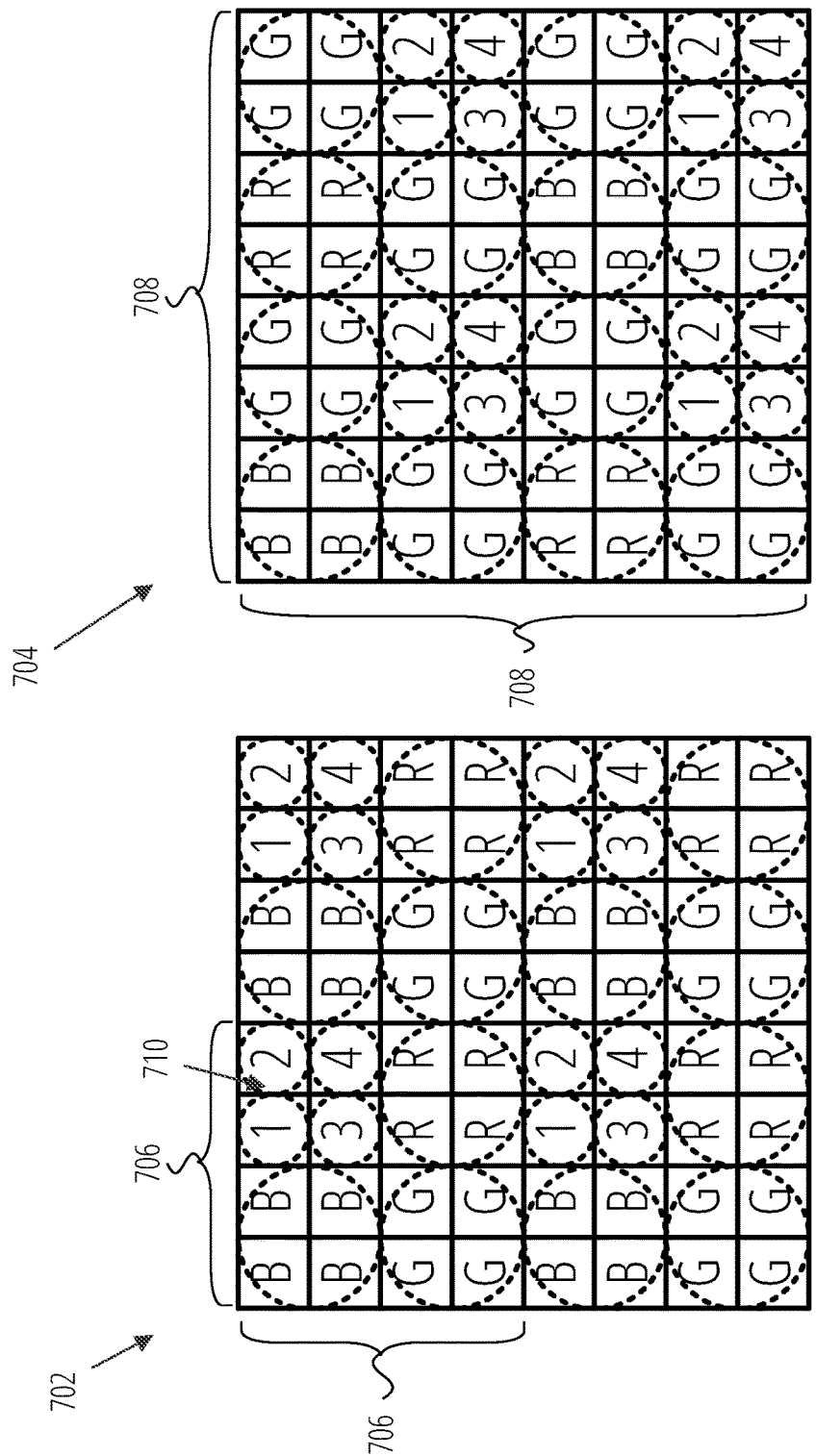
FIG. 7 is a schematic drawing that illustrates two non-limiting example embodiments of patterns for image sensors that include phase detection photodiodes and polarization detection photodiodes according to various aspects of the present disclosure.

FIG. 7 is a schematic drawing that illustrates two non-limiting example embodiments of patterns for image sensors that include phase detection photodiodes and polarization detection photodiodes according to various aspects of the present disclosure. A pattern 702 is similar to the image sensor 100 illustrated in FIG. 2, in that the pattern 702 is made up of a repeating unit 706 that includes four 2×2 square groups of photodiodes. Like in FIG. 2, a first group of four photodiodes is associated with a color filter of a first spectral photoresponse (signified by the boxes with a "B"), a second group of four photodiodes is associated with a color filter of a second spectral photoresponse (signified by the boxes with a "G"), and a third group of four photodiodes is associated with a color filter of a third spectral photoresponse (signified by the boxes with an "R"). Each of these groups of photodiodes includes a microlens that is arranged over at least a portion of all four of the photodiodes in the group (signified by the dashed circles over the boxes marked with B, G, or R). Because these groups of photodiodes are associated with shared microlenses, these groups of photodiodes can be used for phase detection/collection of depth information.

Unlike FIG. 2, instead of the repeating unit 706 including a fourth group of four photodiodes associated with a color filter and a single microlens, the repeating unit 706 includes a fourth group of four photodiodes 710 that are configured to obtain polarization information. As shown, each of the photodiodes in the fourth group is associated with a separate microlens. To obtain polarization information, in some embodiments, each of the photodiodes of the group of four photodiodes 710 is associated with a set of polarization wires of a polarization grid. The polarization grid may be placed in the optical path of the photodiodes, such as between the microlens and the photodiode. In some embodiments, the polarization wires are oriented in one of four directions: 0 degrees, 45 degrees, 90 degrees, or 135 degrees. These orientations are indicated in FIG. 7 by the numbers 1, 2, 3, and 4. Accordingly, FIG. 7 illustrates that the group of four photodiodes 710 of the pattern 702 includes one photodiode in each of the four orientations. In some embodiments, different directions than these may be used. In some embodiments, only three of the four orientations may be used. As with FIG. 2, the repeating unit 706 collectively forms a pixel of the image sensor, and the pattern of the repeating unit 706 is repeated multiple times to form the face of the image sensor.

FIG. 7 also illustrates a pattern 704. The pattern 704 is similar to the pattern 702, in that it includes square groups of four photodiodes that are either associated with a single type of color filter and a shared microlens (and can be used for phase detection), or are associated with polarization wires and individual microlenses (and can be used for polarization detection). However, in the pattern 704, the color filters are arranged in a different pattern, such that the repeating unit 708 uses sixteen groups of four photodiodes (eight photodiodes to a side) before the pattern is repeated.

Figure 8:
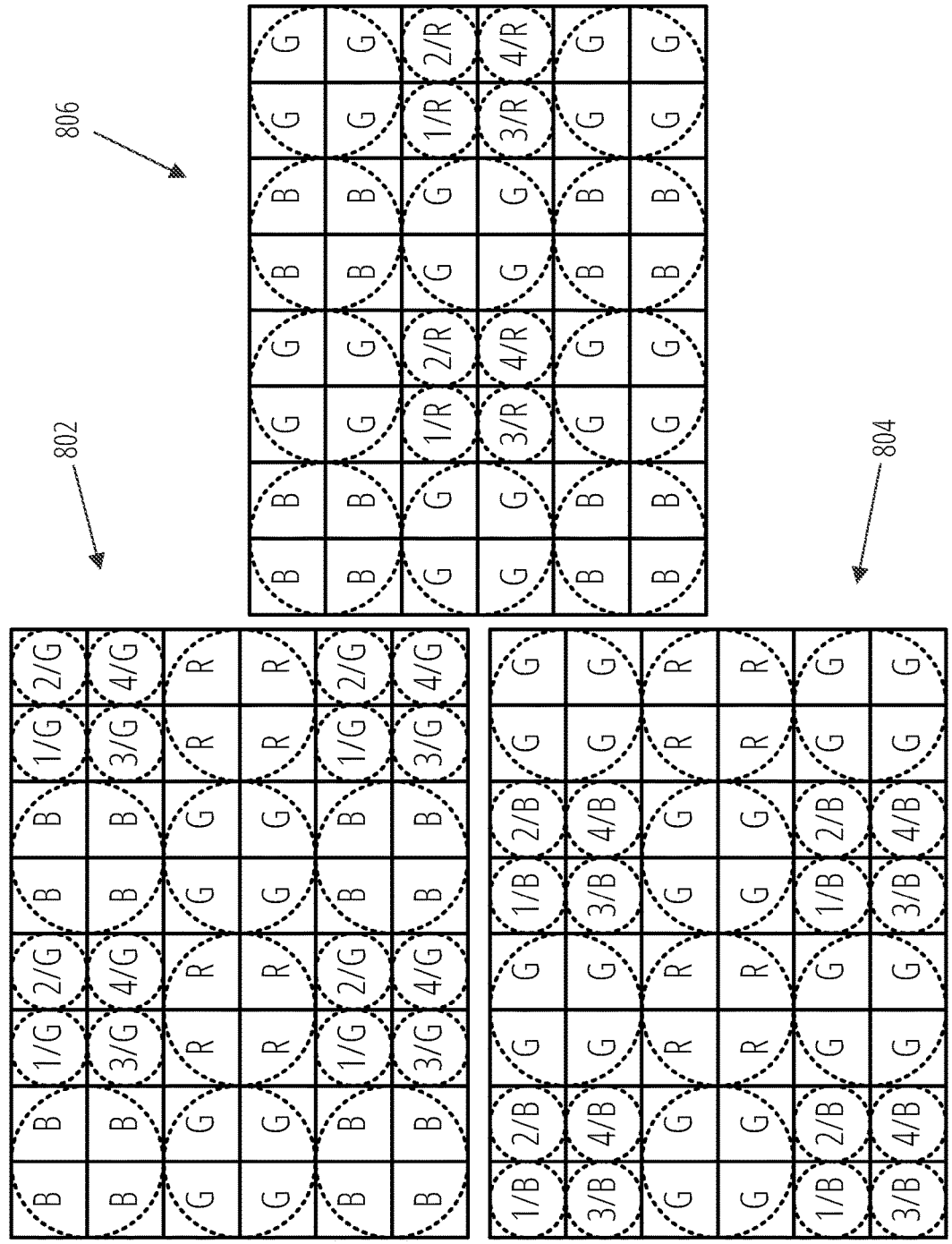
FIG. 8 is a schematic drawing that illustrates three additional non-limiting example embodiments of patterns for image sensors that include phase detection photodiodes and polarization detection photodiodes according to various aspects of the present disclosure.

FIG. 8 is a schematic drawing that illustrates three additional non-limiting example embodiments of patterns for image sensors that include phase detection photodiodes and polarization detection photodiodes according to various aspects of the present disclosure. The pattern 802, pattern 804, and pattern 806 illustrated in FIG. 8 include similar components as the pattern 702 and pattern 704 illustrated in FIG. 7, but for the different layouts of the components, and for the fact that the polarization detection photodiodes are associated with color filters.

Figure 9:
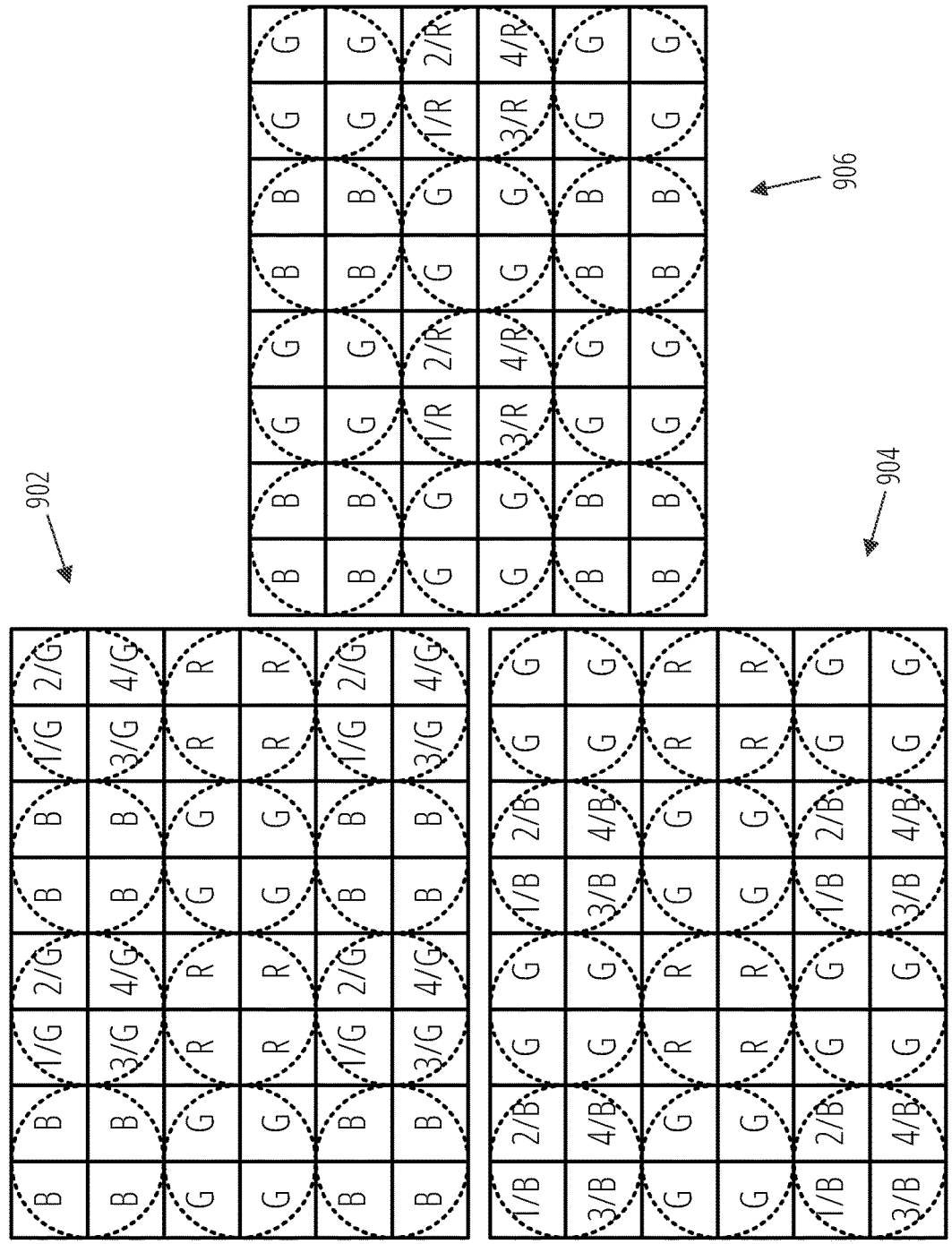
FIG. 9 is a schematic drawing that illustrates three more non-limiting example embodiments of patterns for image sensors that include phase detection photodiodes and polarization detection photodiodes according to various aspects of the present disclosure.

FIG. 9 is a schematic drawing that illustrates three more non-limiting example embodiments of patterns for image sensors that include phase detection photodiodes and polarization detection photodiodes according to various aspects of the present disclosure. The pattern 902, pattern 904, and pattern 906 illustrated in FIG. 9 also include square groups of four photodiodes, with components similar to those illustrated and described in FIG. 7. However, in FIG. 9, the pattern 902, the pattern 904, and the pattern 906 have different layouts for the components, and have polarization detection photodiodes that are associated with color filters (as in FIG. 8). Also, in the pattern 902, the pattern 904, and the pattern 906, instead of each polarization detection photodiode being associated with an individual microlens, the square groups of four polarization detection photodiodes each use a single shred microlens.

Figure 10:
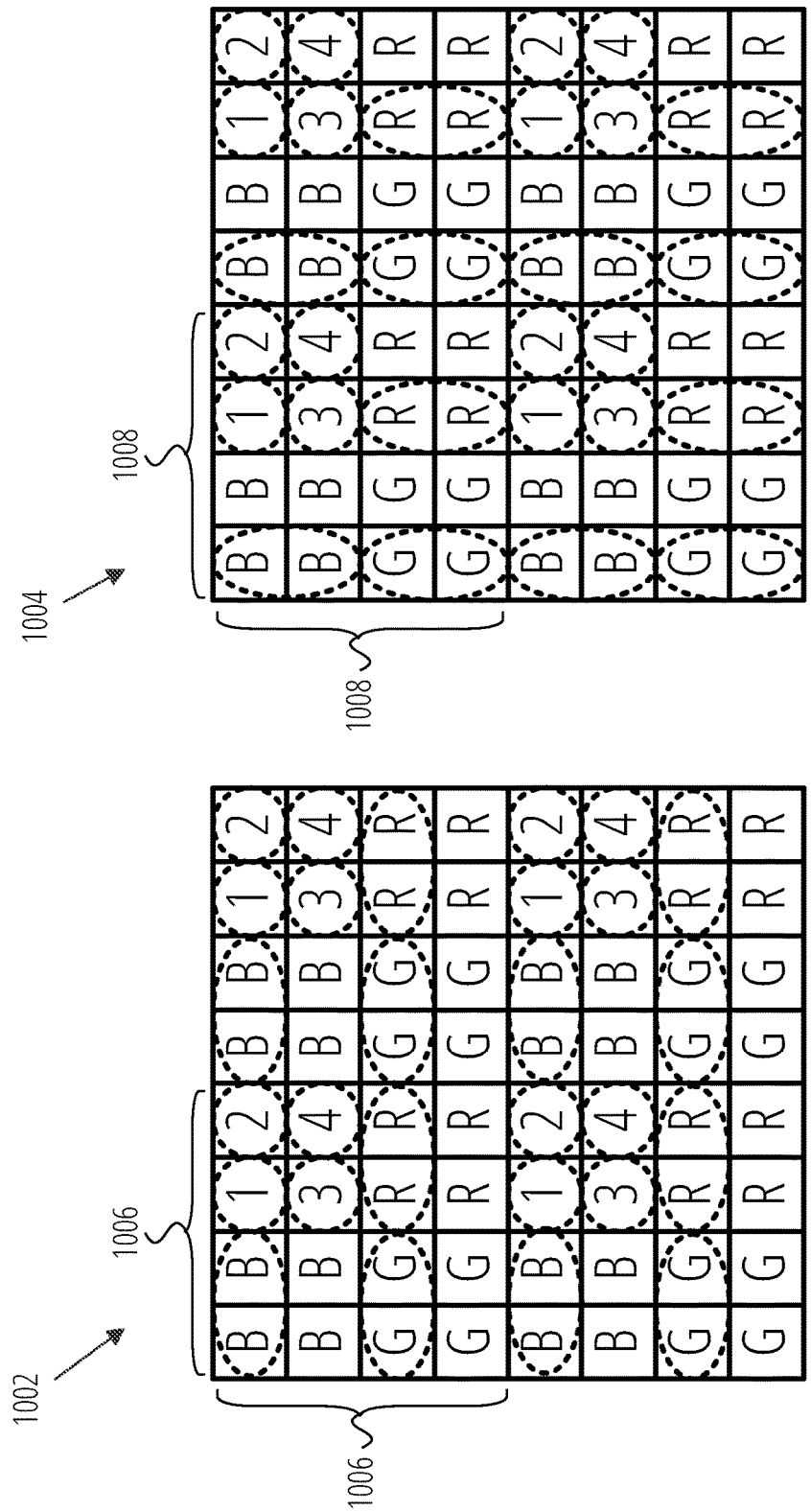
FIG. 10 is a schematic drawing that illustrates two more non-limiting example embodiments of patterns for image sensors that include phase detection photodiodes and polarization detection photodiodes according to various aspects of the present disclosure.

FIG. 10 is a schematic drawing that illustrates two more non-limiting example embodiments of patterns for image sensors that include phase detection photodiodes and polarization detection photodiodes according to various aspects of the present disclosure. Similar to FIG. 7, the pattern 1002 illustrated in FIG. 10 uses a repeating unit 1006 that includes four square groups of four photodiodes, three of which groups are associated with color filters, and one of which groups is associated with polarization wires. As in FIG. 7, each of the polarization detection photodiodes is associated with a separate microlens. Unlike FIG. 7, however, the shared microlenses are arranged over fewer than all of the photodiodes of each group of four photodiodes. The pattern 1002 includes shared microlenses over only two of the photodiodes in each group of four photodiodes. As shown, the microlenses are situated over horizontally adjacent photodiodes, leaving the remaining photodiodes of each group of four photodiodes uncovered by a microlens. A pattern 1004 is similar to the pattern 1002, but the repeating unit 1008 of the pattern 1004 includes microlenses that are situated over vertically adjacent photodiodes instead of horizontally adjacent photodiodes.

Figure 11:
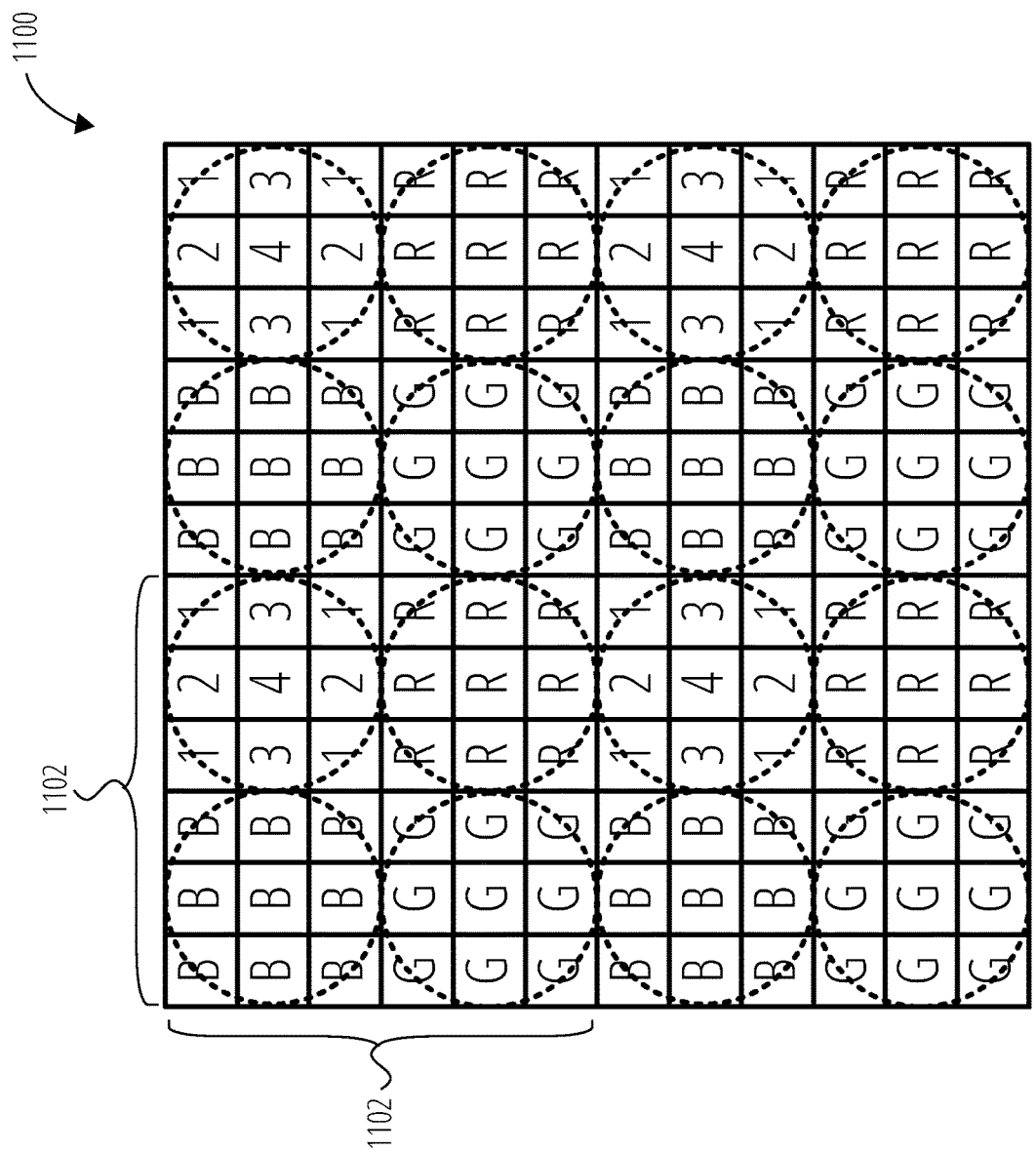
FIG. 11 is a schematic drawing that illustrates another non-limiting example embodiment of a pattern for an image sensor that includes phase detection photodiodes and polarization detection photodiodes according to various aspects of the present disclosure.

FIG. 11 is a schematic drawing that illustrates another non-limiting example embodiment of a pattern for an image sensor that includes phase detection photodiodes and polarization detection photodiodes according to various aspects of the present disclosure. In the pattern 1100, instead of using 2×2 square groups of photodiodes in its repeating unit 1102, 3×3 square groups of photodiodes are used. As shown, a first 3×3 group of nine photodiodes is associated with a single shared microlens and a color filter of a first spectral photoresponse, a second 3×3 group of nine photodiodes is associated with a single shared microlens and a color filter of a second spectral photoresponse, and a third 3×3 group of nine photodiodes is associated with a single shared microlens and a color filter of a third spectral photoresponse. Photodiodes of a fourth 3×3 group of nine photodiodes are associated with polarization wires. In this group, four of the photodiodes are associated with polarization wires in a first orientation, two of the photodiodes are associated with polarization wires in a second orientation, two of the photodiodes are associated with polarization wires in a third orientation, and one of the photodiodes is associated with polarization wires in a fourth orientation. As illustrated, the nine polarization photodiodes are associated with a single shared microlens.

Figure 12:
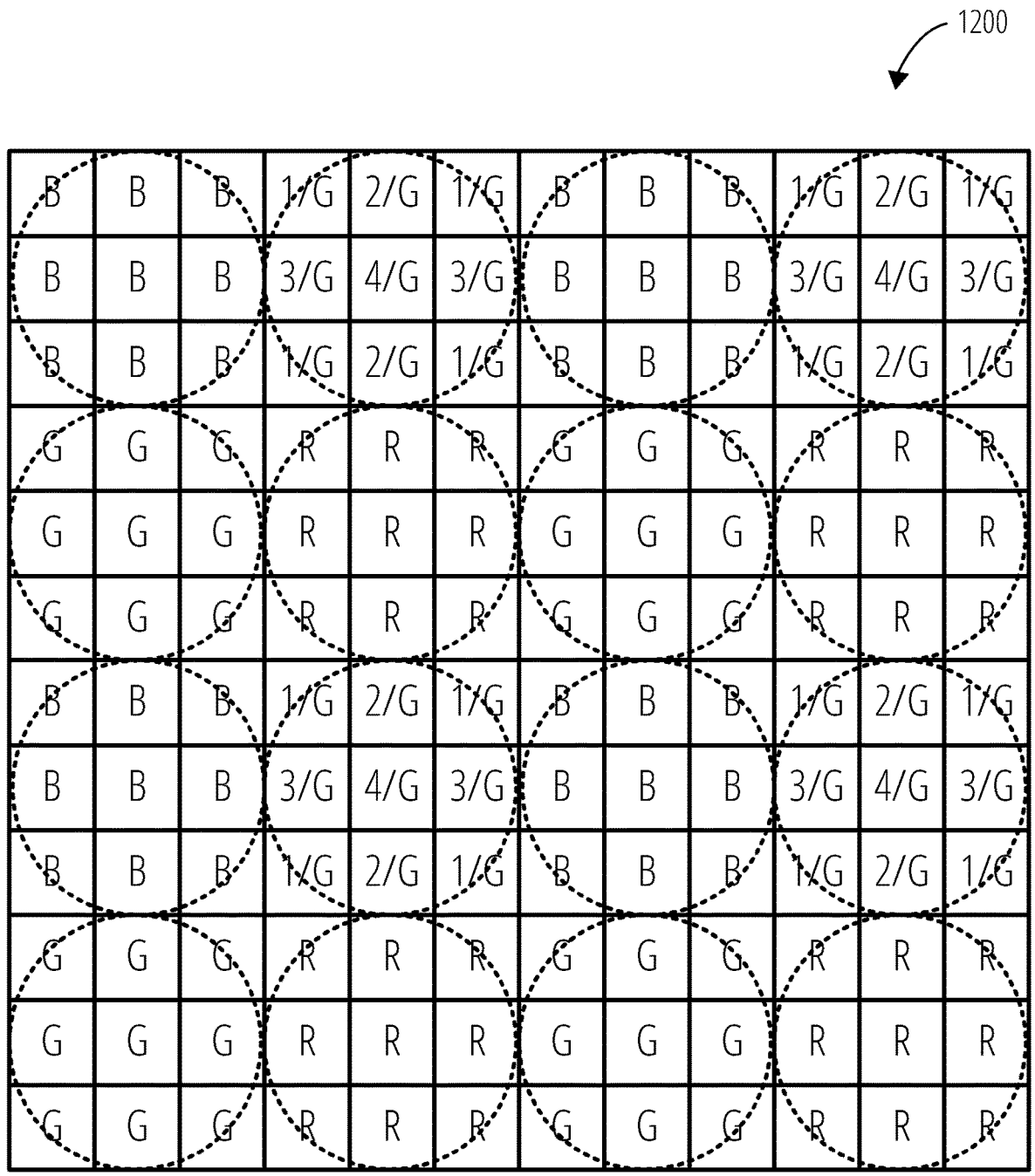
FIG. 12 is a schematic drawing that illustrates yet another non-limiting example embodiment of a pattern for an image sensor that includes phase detection photodiodes and polarization detection photodiodes according to various aspects of the present disclosure.

FIG. 12 is a schematic drawing that illustrates yet another non-limiting example embodiment of a pattern for an image sensor that includes phase detection photodiodes and polarization detection photodiodes according to various aspects of the present disclosure. The pattern 1200 includes components similar to those illustrated and described with respect to FIG. 11. However, in the pattern 1200, the polarization detection photodiodes are associated with color filters. This illustrated layout is a non-limiting example only, and in some embodiments, the layout of the color filters and/or the polarization detection photodiodes may be different.

Figure 13:
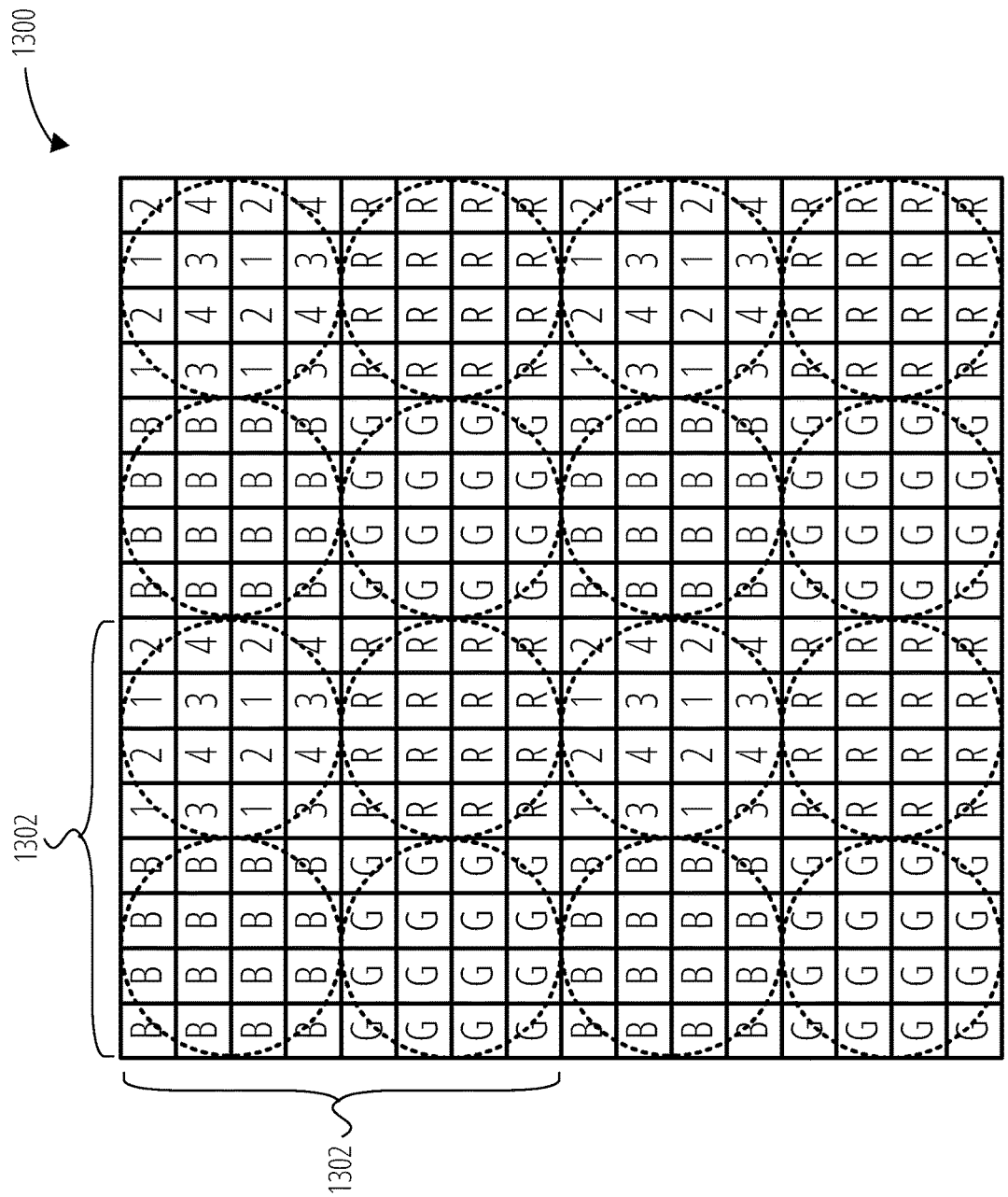
FIG. 13 is a schematic drawing that illustrates yet another non-limiting example embodiment of a pattern for an image sensor that includes phase detection photodiodes and polarization detection photodiodes according to various aspects of the present disclosure.

FIG. 13 is a schematic drawing that illustrates yet another non-limiting example embodiment of a pattern for an image sensor that includes phase detection photodiodes and polarization detection photodiodes according to various aspects of the present disclosure. In the pattern 1300, instead of using 2×2 square groups of photodiodes or 3×3 square groups of photodiodes in its repeating unit 1302, 4×4 square groups of photodiodes are used. As shown, a first 4×4 group of sixteen photodiodes is associated with a single shared microlens and a color filter of a first spectral photoresponse, a second 4×4 group of sixteen photodiodes is associated with a single shared microlens and a color filter of a second spectral photoresponse, and a third 4×4 group of sixteen photodiodes is associated with a single shared microlens and a color filter of a third spectral photoresponse. Photodiodes of a fourth 4×4 group of sixteen photodiodes are associated with polarization wires. In this group, four photodiodes are associated with polarization wires in a first orientation, four photodiodes are associated with polarization wires in a second orientation, four photodiodes are associated with polarization wires in a third orientation, and four photodiodes are associated with polarization wires in a fourth orientation. As illustrated, the sixteen polarization photodiodes are associated with a single shared microlens. In some embodiments, the photodiodes of the fourth 4×4 group of sixteen photodiodes may also be associated with a color filter of the first, second, or third spectral photoresponse.

Figure 14:
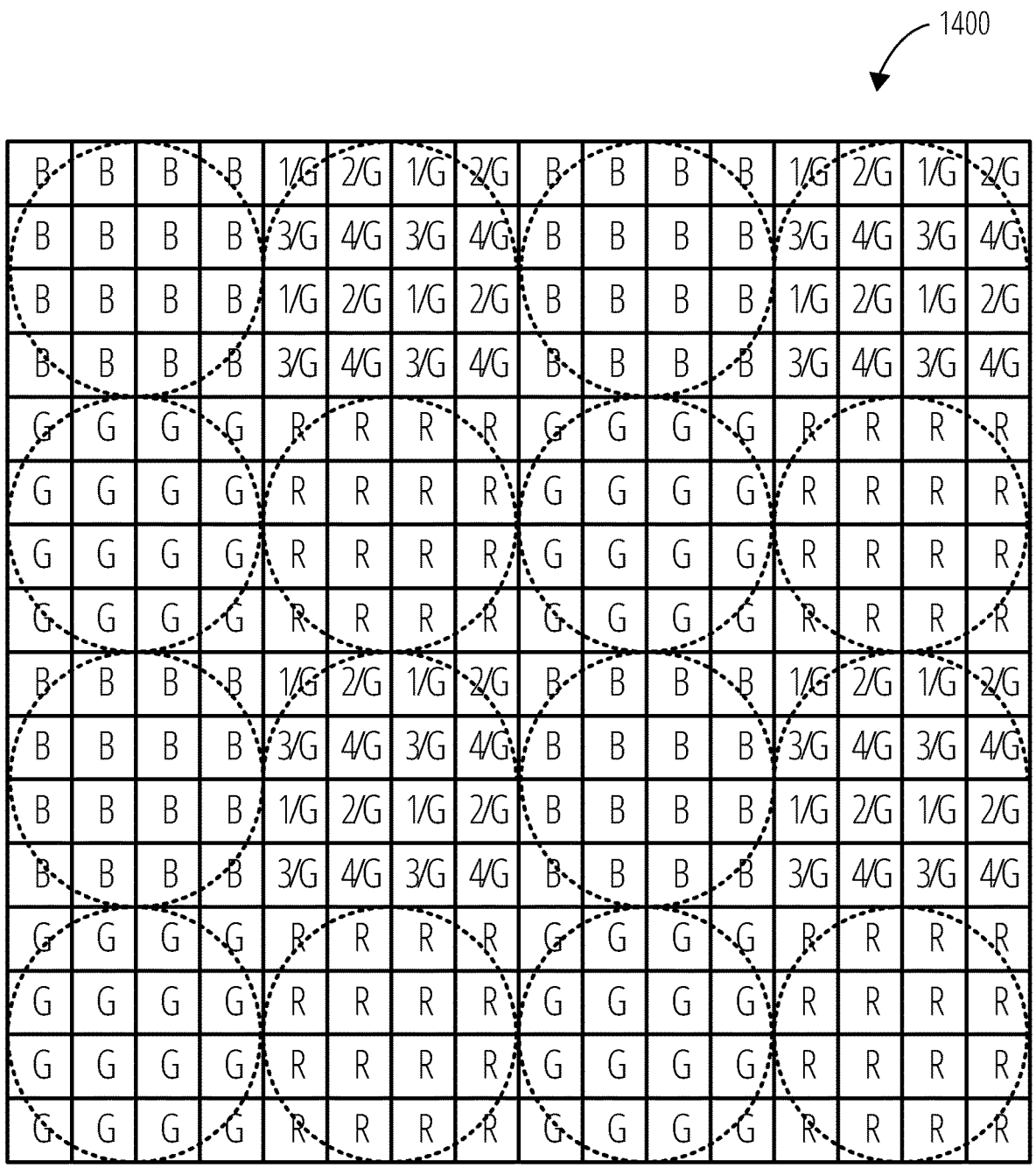
FIG. 14 is a schematic drawing that illustrates yet another non-limiting example embodiment of a pattern for an image sensor that includes phase detection photodiodes and polarization detection photodiodes according to various aspects of the present disclosure.

FIG. 14 is a schematic drawing that illustrates yet another non-limiting example embodiment of a pattern for an image sensor that includes phase detection photodiodes and polarization detection photodiodes according to various aspects of the present disclosure. The pattern 1400 includes components similar to those illustrated and described with respect to FIG. 13. However, in the pattern 1400, the polarization detection photodiodes are associated with color filters. This illustrated layout is a non-limiting example only, and in some embodiments, the layout of the color filters and/or the polarization detection photodiodes may be different.

Figure 15:
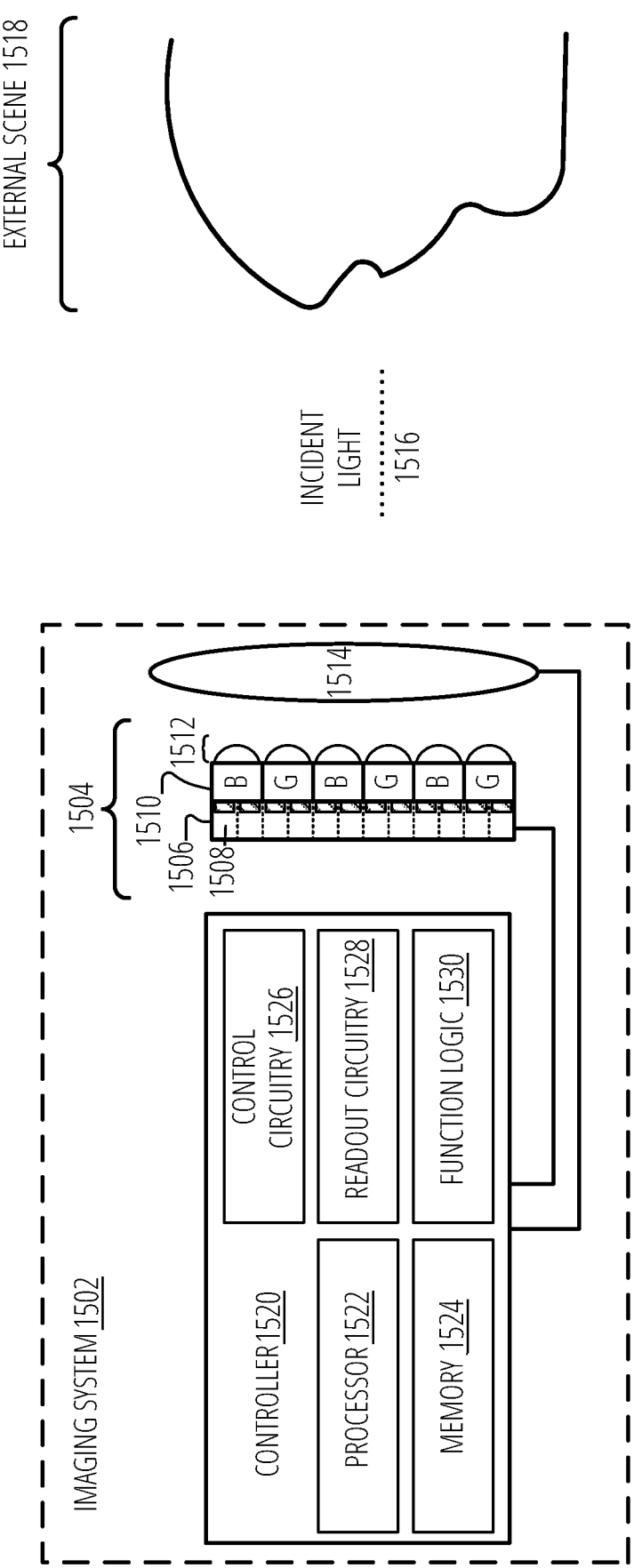
FIG. 15 is a functional block diagram of a non-limiting example embodiment of an imaging system including an image sensor with shared microlenses, according to various aspects of the present disclosure.

FIG. 15 is a functional block diagram of a non-limiting example embodiment of an imaging system 1502 including an image sensor 1504 with shared microlenses, according to various aspects of the present disclosure. Imaging system 1502 is capable of focusing on a point of interest (POI) within an external scene 1518 in response to incident light 1516. Imaging system 1502 includes image sensor 1504 to generate electrical or image signals in response to incident light 1516, objective lens(es) 1514 with adjustable optical power to focus on one or more points of interest within the external scene 1518, and controller 1520 to control, inter alia, operation of image sensor 1504 and objective lens(es) 1514. Image sensor 1504 is one possible implementation of an image sensor as illustrated in any of FIG. 1-FIG. 13 and includes a semiconductor material 1506 with a plurality of photodiodes 1508 disposed within respective portions of the semiconductor material 1506, a plurality of color filters 1510, and a plurality of microlenses 1512. The controller 1520 includes one or more processor 1522, memory 1524, control circuitry 1526, readout circuitry 1528, and function logic 1530.

The controller 1520 includes logic and/or circuitry to control the operation (e.g., during pre-, post-, and in situ phases of image and/or video acquisition) of the various components of imaging system 1502. The controller 1520 may be implemented as hardware logic (e.g., application specific integrated circuits, field programmable gate arrays, system-on-chip, etc.), software/firmware logic executed on a general-purpose microcontroller or microprocessor, or a combination of both hardware and software/firmware logic. In one embodiment, the controller 1520 includes the processor 1522 coupled to memory 1524 that store instructions for execution by the controller 1520 or otherwise by one or more components of the imaging system 1502. The instructions, when executed by the controller 1520, may cause the imaging system 1502 to perform operations that may be associated with the various functional modules, logic blocks, or circuitry of the imaging system 1502 including any one of, or a combination of, the control circuitry 1526, the readout circuitry 1528, the function logic 1530, image sensor 1504, objective lens 1514, and any other element of imaging system 1502 (illustrated or otherwise). The memory is a non-transitory computer-readable medium that may include, without limitation, a volatile (e.g., RAM) or non-volatile (e.g., ROM) storage system readable by controller 1520. It is further appreciated that the controller 1520 may be a monolithic integrated circuit, one or more discrete interconnected electrical components, or a combination thereof. Additionally, in some embodiments the one or more electrical components may be coupled to one another to collectively function as the controller 1520 for orchestrating operation of the imaging system 1502.

Control circuitry 1526 may control operational characteristics of the image pixel array (e.g., exposure duration, when to capture digital images or videos, and the like). Readout circuitry 1528 reads or otherwise samples the analog signal from the individual photodiodes (e.g., read out electrical signals generated by each of the plurality of photodiodes 1508 in response to incident light to generate a phase detection auto focus signal, a depth information signal, polarization information signals, read out image signals to capture an image frame, and the like) and may include amplification circuitry, analog-to-digital (ADC) circuitry, image buffers, or otherwise. In the illustrated embodiment, readout circuitry 1528 is included in controller 1520, but in other embodiments readout circuitry 1528 may be separate from the controller 1520. Function logic 1530 is coupled to the readout circuitry 1528 to receive the electrical signals to generate a phase-detection auto focus (PDAF) signal in response, generate an image in response to receiving image signals or data, determine ambiguous surface normals based on polarization information and disambiguate the surface normals using depth information to generate a three-dimensional shape image, and the like. In some embodiments, the electrical or image signals may be respectively stored as a PDAF signal, three-dimensional shape data, or image data and may be manipulated by the function logic 1530 (e.g., demosaic the image data, apply post image effects such as crop, rotate, remove red eye, adjust brightness, adjust contrast, or otherwise).

Figure 16:
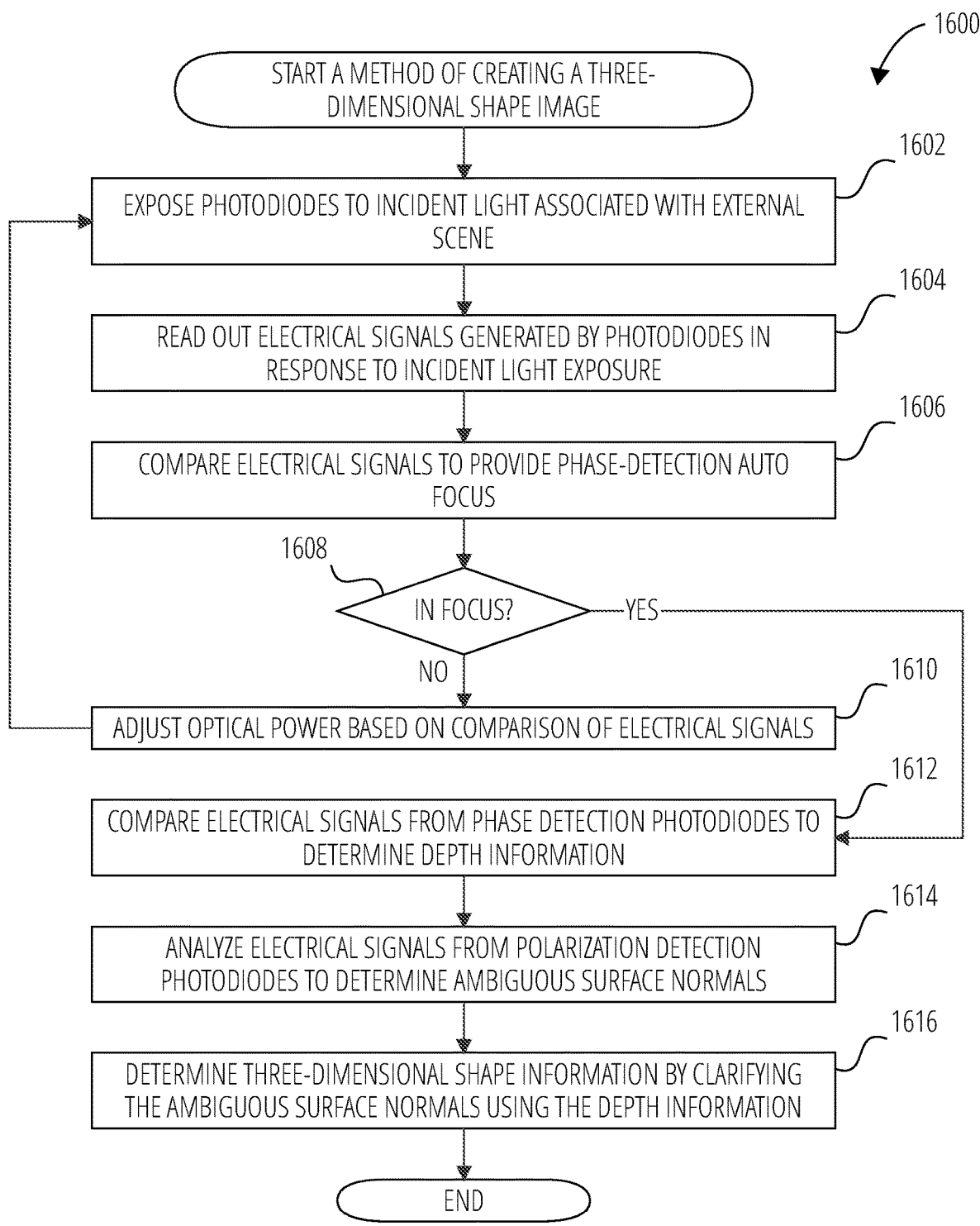
FIG. 16 is a flowchart that illustrates a non-limiting example embodiment of a method of creating a three-dimensional shape image according to various aspects of the present disclosure.

FIG. 16 is a flowchart that illustrates a non-limiting example embodiment of a method of creating a three-dimensional shape image according to various aspects of the present disclosure. In some embodiments, the method 1600 may be implemented by imaging system 1502 illustrated in FIG. 15 and/or any of the image sensors illustrated in FIG. 1-FIG. 13. It is appreciated that the numbered blocks of the method 1600 may occur in any order and even in parallel. Additionally, blocks may be added to, or removed from, method 1600 in accordance with the teachings of the present disclosure.

At a start block, the method 1600 initializes the imaging system 1502 upon receipt of a signal (e.g., a depressed shutter button of the imaging system 1502, or any other suitable signal) to capture an image frame representative of an external scene 1518. During initialization, a point of interest (POI) of the external scene 1518 to be imaged by the image sensor 1504 may be provided (e.g., selected by a user of the imaging system 1502), automatically detected (e.g., during a subsequent step with a phase detection auto-focus signal), or otherwise obtained. The POI may represent one or more regions of the external scene 1518 that are desired to be in focus, and/or one or more regions of the external scene 1518 for which three-dimensional shape data is desired.

From the start block, the method 1600 proceeds to block 1602 through block 1610, which include actions for generating a phase detection auto focus (PDAF) signal using an image sensor with shared microlens and, if necessary, adjusting optical power of an objective lens to configure the imaging system to focus on one or more points of interest as illustrated in various embodiments of the disclosure. More specifically, the utilized image sensor includes groups of photodiodes arranged with (i.e., optically aligned with) common microlenses such that each subpixel within the image pixel array of the image sensor may be configured as a phase detector.

At block 1602, the plurality of photodiodes are exposed to incident light associated with an external scene. In response to the incident light the plurality of photodiodes generate electrical signals proportional to the intensity of the incident light.

At block 1604, electrical signals are read out (e.g., via readout circuitry 1528 illustrated in FIG. 15) in response to the incident light. Electrical signals may be read out individually from respective subpixels (e.g., by transferring the image charge generated in each of the photodiodes as an electrical signal one row at a time to column storage capacitors, and then reading out the elements individually using a column decoder coupled to a multiplexer) in response to the incident light such that each of the electrical signals generated by a corresponding photodiode included in a group of photodiodes sharing a common color filter and microlens may be grouped together.

At block 1606, the electrical signals are compared to provide phase-detection auto focus for the imaging system. Function logic 1530 may be utilized to generate the PDAF signal based, at least in part, on a comparison between the electrical signals associated with at least a group of four photodiodes included in the plurality of photodiodes. In some embodiments, the electrical signals that are grouped together due to sharing a common color filter and common microlens may be compared to one another to operate as a phase detector. In some embodiments, the function logic 1530 generates the PDAF signal by comparing the electrical signals between adjacent photodiodes included in the group of four photodiodes and further comparing the electrical signals between diagonal photodiodes included in the group of four photodiodes.

At decision block 1608, a determination is made regarding whether the point of interest is in focus based, at least in part, on the comparison between the electrical signals. In some embodiments, one or more phase images are generated based on the electrical signals. For example, if a shared microlens is optically aligned with four photodiodes, the electrical signal from each respective quadrant may be utilized to generate respective phase images (i.e., four phase images). Each of the phase images may be compared (i.e., groups of the electrical signals associated with a common microlens of a respective one of the 2-by-2 array of photodiodes) are compared to generate a PDAF signal that provides multi-directional information as to whether the point of interest is in focus.

If the point of interest is not in focus, then the result of decision block 1608 is NO, and the method 1600 proceeds to block 1610, where optical power (e.g., provided by an objective lens 1514) is adjusted based on the comparison of the electrical signals. In other words, the comparison allows for determining if the optical power of the objective lens 1514 results in the external scene 1518 being in focus, front focused, or back focused and provides instructions to adjust the optical power accordingly. Once the optical power of the objective lens is adjusted, the method 1600 returns to block 1602.

Returning to decision block 1608, if the point of interest is in focus, then the result of decision block 1608 is YES, and the method 1600 proceeds to block 1612. At block 1612, the electrical signals associated with different phase detection photodiodes (e.g., photodiodes that share common microlenses) are compared to determine relative depth information for generating a depth map of the external scene 1518. In some embodiments, the PDAF signal or a depth map associated with the PDAF signal may be used as depth information without performing a separate comparison.

At block 1614, electrical signals from polarization detection photodiodes (e.g., photodiodes that are associated with polarization wires) are analyzed to determine ambiguous surface normals, and at block 1616, three-dimensional shape information is determined by clarifying the ambiguous surface normals using the depth information. Once the disambiguated surface normals are obtained, they may be provided as a three-dimensional shape image as a result of the method 1600 (or may be used to generate such a three-dimensional shape image).

Any suitable technique may be used to obtain the ambiguous surface normals from the electrical signals from the polarization wires. For example, the intensity at a given image point, for a given polarizer angle $\phi_{pol}$, may be given as:

$$I(\phi_{pol}) = \frac{I_{max} + I_{min}}{2} + \frac{I_{max} - I_{min}}{2}\cos(2(\phi_{pol} - \varphi))$$

wherein the three unknown variables in this equation are $I_{max}$, $I_{min}$, and the azimuth angle ($\varphi$). It can be seen that the azimuth angle is ambiguous, because an azimuth angle of $\varphi$ and $\varphi+\pi$ return the same value for the above equation. As another example, the azimuth angle may be determined from the Stokes vector derived from four samples from polarization photodetectors of different polarizations:

$$S_0 = \text{Intensity} = I_{tot}$$
$$S_0 = I_{0°} + I_{90°}$$
$$S_1 = I_{0°} - I_{90°}$$
$$S_2 = I_{45°} - I_{135°}$$
$$DoLP = \rho = \frac{\sqrt{S_1^2 + S_2^2}}{S_0}, DoLP \in [0, 1]$$
$$AoLP = \frac{1}{2}\arctan\left(\frac{S_2}{S_1}\right), AoLP \in [0°, 180°]$$

The degree of linear polarization (DoLP) may be used to obtain the zenith angle of the surface normal as follows:

$$\rho = \frac{\left(n - \frac{1}{n}\right)^2 \sin^2\theta}{2 + 2n^2 - \left(n + \frac{1}{n}\right)^2 \sin^2\theta + 4\cos\theta\sqrt{n^2 - \sin^2\theta}}$$

wherein θ is the zenith angle, and n is the refractive index.

The angle of linear polarization (AoLP) may be used to obtain the ambiguous azimuth angle as follows:

$$\psi = \frac{1}{2}\begin{cases} \arctan\left(\frac{S_2}{S_1}\right) + \frac{\pi}{2}, & S_1 \geq 0. \\ \arctan\left(\frac{S_2}{S_1}\right) + \pi, & S_1 > 0 \text{ and } S_2 < S_1 \\ \arctan\left(\frac{S_2}{S_1}\right) + 0, & S_1 > 0 \text{ and } S_2 \geq S_1 \end{cases}$$

Ambiguous Azimuth Angle = $\psi$ + (0 or $\pi$)

Different techniques may be used for varying materials. For example, the above techniques may be used for imaging dielectric surfaces, while other techniques may be used for non-dielectric surfaces such as mirrors or metals.

Once the ambiguous azimuth angle and the zenith angle are obtained, any suitable technique may be used to disambiguate the ambiguous azimuth angles using the depth information. For example, in some embodiments, techniques are used to generate a separate set of surface normals based on the depth information. An operator $\mathcal{A}$ may then be found that relates the normals based on the polarization information and the normals based on the depth information, such that the variation between the two sets of normals can be minimzed as a total variation minimization problem. Once the operator $\mathcal{A}$ is obtained, it can be applied to disambiguate the polarization normals.

The method 1600 then proceeds to an end block and terminates.

While the preferred embodiment of the invention has been illustrated and described, it will be appreciated that various changes can be made therein without departing from the spirit and scope of the invention. Thus, the above description of illustrated examples of the present invention, including what is described in the Abstract, are not intended to be exhaustive or to be a limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. An image sensor, comprising:
a plurality of photodiodes arranged as a photodiode array, wherein the plurality of photodiodes includes:
a first set of photodiodes configured as phase detection photodiodes; and
a second set of photodiodes configured as polarization detection photodiodes;
wherein the first set of photodiodes configured as phase detection photodiodes includes:
at least one square group of photodiodes; and
at least one microlens arranged over more than one photodiode of the at least one square group of photodiodes; and
wherein the at least one microlens is arranged over fewer than all of the photodiodes of the at least one square group of photodiodes.

2. The image sensor of claim 1, wherein the at least one microlens is arranged over at least a portion of all of the photodiodes of the at least one square group of photodiodes.

3. The image sensor of claim 2, wherein the at least one square group of photodiodes includes four photodiodes, nine photodiodes, or sixteen photodiodes.

4. The image sensor of claim 1, wherein the at least one microlens is arranged over a horizontally adjacent pair of photodiodes.

5. The image sensor of claim 1, wherein the at least one microlens is arranged over a vertically adjacent pair of photodiodes.

6. The image sensor of claim 1, wherein the second set of photodiodes configured as polarization detection photodiodes includes at least one square group of four photodiodes, and wherein the image sensor further comprises:
at least four microlenses, each microlens arranged over one photodiode of the four photodiodes;
polarization wires in a first orientation that correspond with a first photodiode of the four photodiodes;
polarization wires in a second orientation that correspond with a second photodiode of the four photodiodes;
polarization wires in a third orientation that correspond with a third photodiode of the four photodiodes; and
polarization wires in a fourth orientation that correspond with a fourth photodiode of the four photodiodes.

7. The image sensor of claim 1, wherein the second set of photodiodes configured as polarization detection photodiodes includes at least one square group of nine photodiodes, and wherein the image sensor further comprises:
polarization wires in a first orientation that correspond with four of the nine photodiodes;
polarization wires in a second orientation that correspond with two of the nine photodiodes;
polarization wires in a third orientation that correspond with two of the nine photodiodes; and
polarization wires in a fourth orientation that correspond with one of the nine photodiodes.

8. The image sensor of claim 7, further comprising at least one microlens arranged over the at least one square group of nine photodiodes.

9. The image sensor of claim 7, further comprising a color filter arranged over the at least one square group of nine photodiodes.

10. The image sensor of claim 1, wherein the second set of photodiodes configured as polarization detection photodiodes includes at least one square group of sixteen photodiodes, and wherein the image sensor further comprises:
polarization wires in a first orientation that correspond with four of the sixteen photodiodes;
polarization wires in a second orientation that correspond with four of the sixteen photodiodes;
polarization wires in a third orientation that correspond with four of the sixteen photodiodes; and
polarization wires in a fourth orientation that correspond with four of the sixteen photodiodes.

11. The image sensor of claim 10, further comprising at least one microlens arranged over the at least one square group of sixteen photodiodes.

12. The image sensor of claim 10, further comprising a color filter arranged over the at least one square group of sixteen photodiodes.

13. An image sensor, comprising:
a plurality of photodiodes arranged as a photodiode array, wherein the plurality of photodiodes includes:
a first set of photodiodes configured as phase detection photodiodes;
a second set of photodiodes configured as polarization detection photodiodes; and
circuitry configured to:
process signals from the first set of photodiodes to obtain depth information;
process signals from the second set of photodiodes to obtain polarization information;
process the polarization information to obtain an ambiguous set of surface normals; and
process the ambiguous set of surface normals using the depth information to obtain a three-dimensional shape image;
wherein processing signals from the first set of photodiodes to obtain depth information includes comparing electrical signals between photodiodes that have a common corresponding microlens.

14. The image sensor of claim 13, wherein comparing electrical signals between photodiodes that have a common corresponding microlens includes comparing electrical signals between adjacent photodiodes and comparing electrical signals between diagonal photodiodes.

15. A controller comprising circuitry configured to:
process signals from a first set of photodiodes of a photodiode array to obtain depth information;
process signals from a second set of photodiodes of the photodiode array to obtain polarization information;
process the polarization information to obtain an ambiguous set of surface normals; and
process the ambiguous set of surface normals using the depth information to obtain a three-dimensional shape image;
wherein processing signals from the first set of photodiodes of the photodiode array to obtain the depth information includes comparing electrical signals between photodiodes that have a common corresponding microlens.

16. The controller of claim 15, wherein comparing electrical signals between photodiodes that have a common corresponding microlens includes comparing electrical signals between adjacent photodiodes and comparing electrical signals between diagonal photodiodes.

17. An image sensor, comprising:
a plurality of photodiodes arranged as a photodiode array, wherein the plurality of photodiodes includes:
a first set of photodiodes configured as phase detection photodiodes; and
a second set of photodiodes configured as polarization detection photodiodes;
wherein the second set of photodiodes configured as polarization detection photodiodes includes at least one square group of nine photodiodes; and
wherein the image sensor further comprises:
polarization wires in a first orientation that correspond with four of the nine photodiodes;
polarization wires in a second orientation that correspond with two of the nine photodiodes;
polarization wires in a third orientation that correspond with two of the nine photodiodes;
polarization wires in a fourth orientation that correspond with one of the nine photodiodes; and
at least one microlens arranged over the at least one square group of nine photodiodes.

18. The image sensor of claim 17, further comprising a color filter arranged over the at least one square group of nine photodiodes.

19. An image sensor, comprising:
a plurality of photodiodes arranged as a photodiode array, wherein the plurality of photodiodes includes:
a first set of photodiodes configured as phase detection photodiodes; and
a second set of photodiodes configured as polarization detection photodiodes;
wherein the second set of photodiodes configured as polarization detection photodiodes includes at least one square group of sixteen photodiodes, and
wherein the image sensor further comprises:
polarization wires in a first orientation that correspond with four of the sixteen photodiodes;
polarization wires in a second orientation that correspond with four of the sixteen photodiodes;
polarization wires in a third orientation that correspond with four of the sixteen photodiodes;
polarization wires in a fourth orientation that correspond with four of the sixteen photodiodes; and
at least one microlens arranged over the at least one square group of sixteen photodiodes.

20. The image sensor of claim 19, further comprising a color filter arranged over the at least one square group of sixteen photodiodes.

* * * * *